United States Patent [19]
Hirase et al.

[11] Patent Number: 5,672,995
[45] Date of Patent: Sep. 30, 1997

[54] HIGH SPEED MIS-TYPE INTERGRATED CIRCUIT WITH SELF-REGULATED BACK BIAS

[75] Inventors: Junji Hirase; Hironori Akamatsu; Susumu Akamatsu; Takashi Hori, all of Osaka, Japan

[73] Assignee: Matsushita Electric Industrial Co., Ltd., Osaka, Japan

[21] Appl. No.: 340,343

[22] Filed: Nov. 14, 1994

[30] Foreign Application Priority Data

Nov. 15, 1993 [JP] Japan ................... 5-284910

[51] Int. Cl.[6] .................. H01J 19/82; G05F 1/10
[52] U.S. Cl. .............. 327/534; 327/537; 327/538; 327/541
[58] Field of Search ................... 327/534, 535, 327/537, 538, 541, 564, 565, 566, 389, 391; 257/367, 369, 364; 365/182, 184; 437/21

[56] References Cited

U.S. PATENT DOCUMENTS

| | | | |
|---|---|---|---|
| 3,646,527 | 2/1972 | Wada et al. | 365/182 |
| 3,657,575 | 4/1972 | Taniguchi et al. | 327/541 |
| 3,932,884 | 1/1976 | Kitamura | 327/566 |
| 4,247,826 | 1/1981 | Gappa et al. | 257/369 |
| 4,271,424 | 6/1981 | Inayoshi et al. | 257/367 |
| 4,490,734 | 12/1984 | Yamada | 257/364 |
| 4,712,192 | 12/1987 | Tanimura et al. | 365/184 |
| 4,964,082 | 10/1990 | Sato et al. | 365/189.09 |
| 5,099,146 | 3/1992 | Miki et al. | 327/534 |
| 5,100,810 | 3/1992 | Yoshimi et al. | 437/21 |
| 5,243,228 | 9/1993 | Maruyama et al. | 327/534 |
| 5,397,934 | 3/1995 | Merrill et al. | 327/534 |
| 5,434,526 | 7/1995 | Tanigashira | 327/534 |

FOREIGN PATENT DOCUMENTS

| | | |
|---|---|---|
| 61-237293 | 10/1986 | Japan. |
| 63-179576 | 7/1988 | Japan. |
| 3-82151 | 4/1991 | Japan. |

OTHER PUBLICATIONS

Tsukasa Ooishi et al., A Well–Synchronized Sensing/Equalizing Method For Sub–1.0v Operating Advaced DRAMs, pp. 81–82.

Primary Examiner—David C. Nelms
Assistant Examiner—Trong Quang Phan
Attorney, Agent, or Firm—McDermott, Will & Emery

[57] ABSTRACT

There are provided a MIS transistor having a substrate portion, a gate, a source, and a drain, a back-bias generator to be applied to the substrate portion of the MIS transistor, and a resistor interposed between the substrate portion of the MIS transistor and the back-bias generator so that the potential between the both ends thereof changes in a range from one value in the active mode to the other value in the standby mode of the MIS transistor. In the MIS transistor, the back bias is self-regulated so that it approaches to zero in the active mode, while it moves away from zero in the standby mode. Consequently, the threshold voltage is reduced in the active mode due to the back bias approaching to zero, so that higher-speed operation is performed. On the other hand, off-state leakage is suppressed in the standby mode due to the back bias moving away from zero. Thus, it becomes possible to constitute a semiconductor apparatus which operates at high speed with low power consumption.

25 Claims, 23 Drawing Sheets

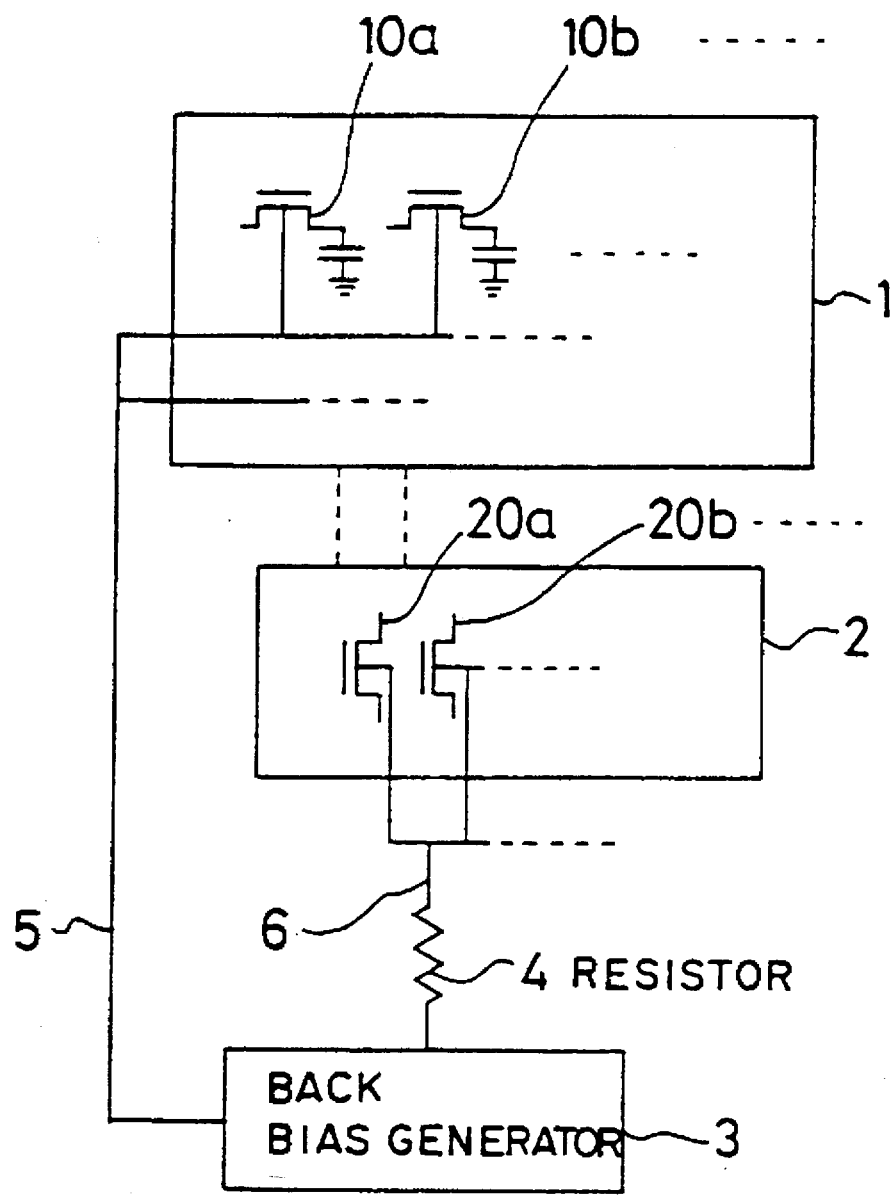

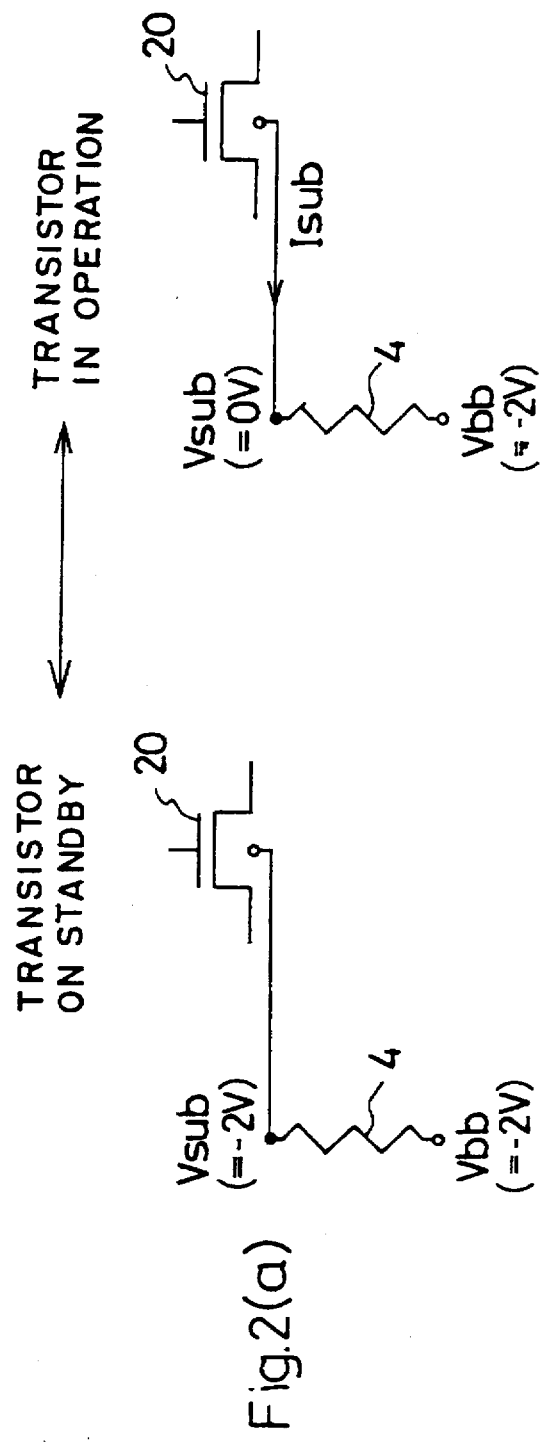
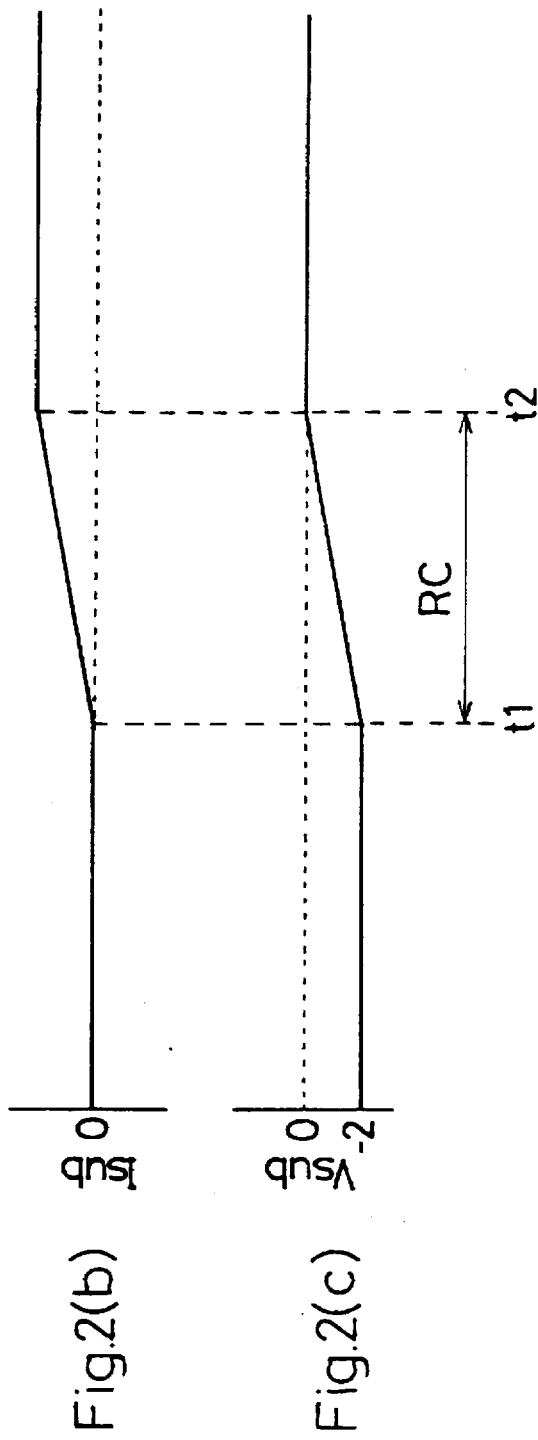
Fig.2(a)
Fig.2(b)
Fig.2(c)

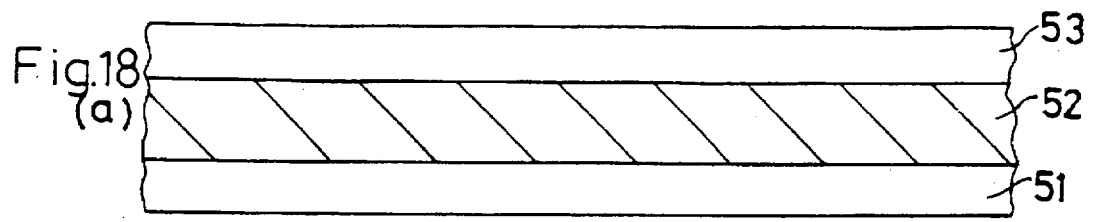
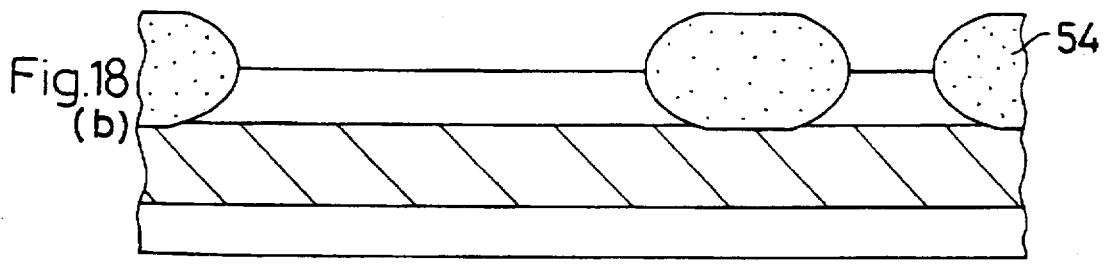
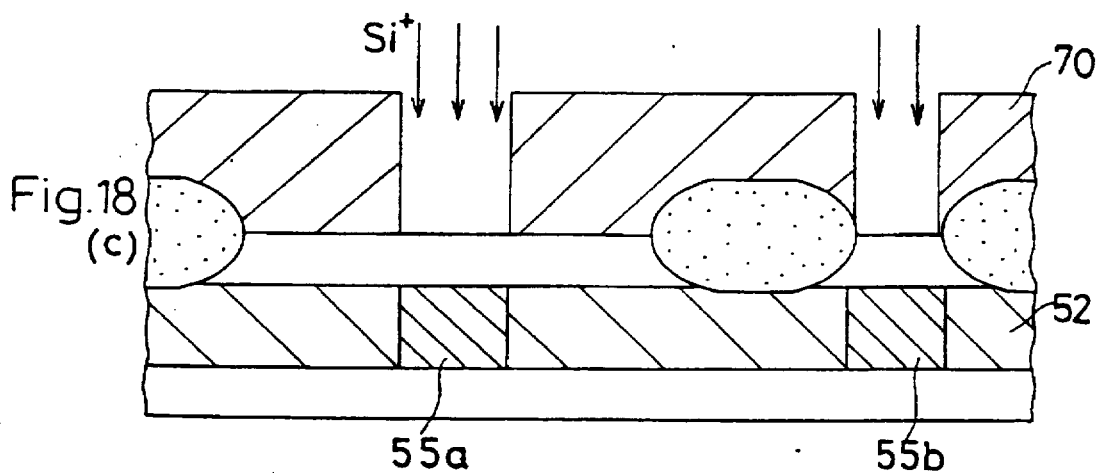
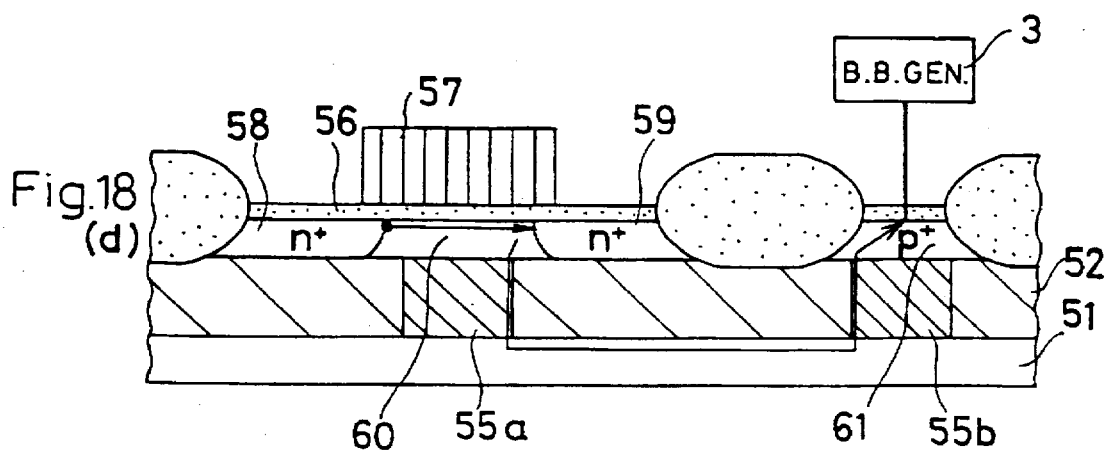

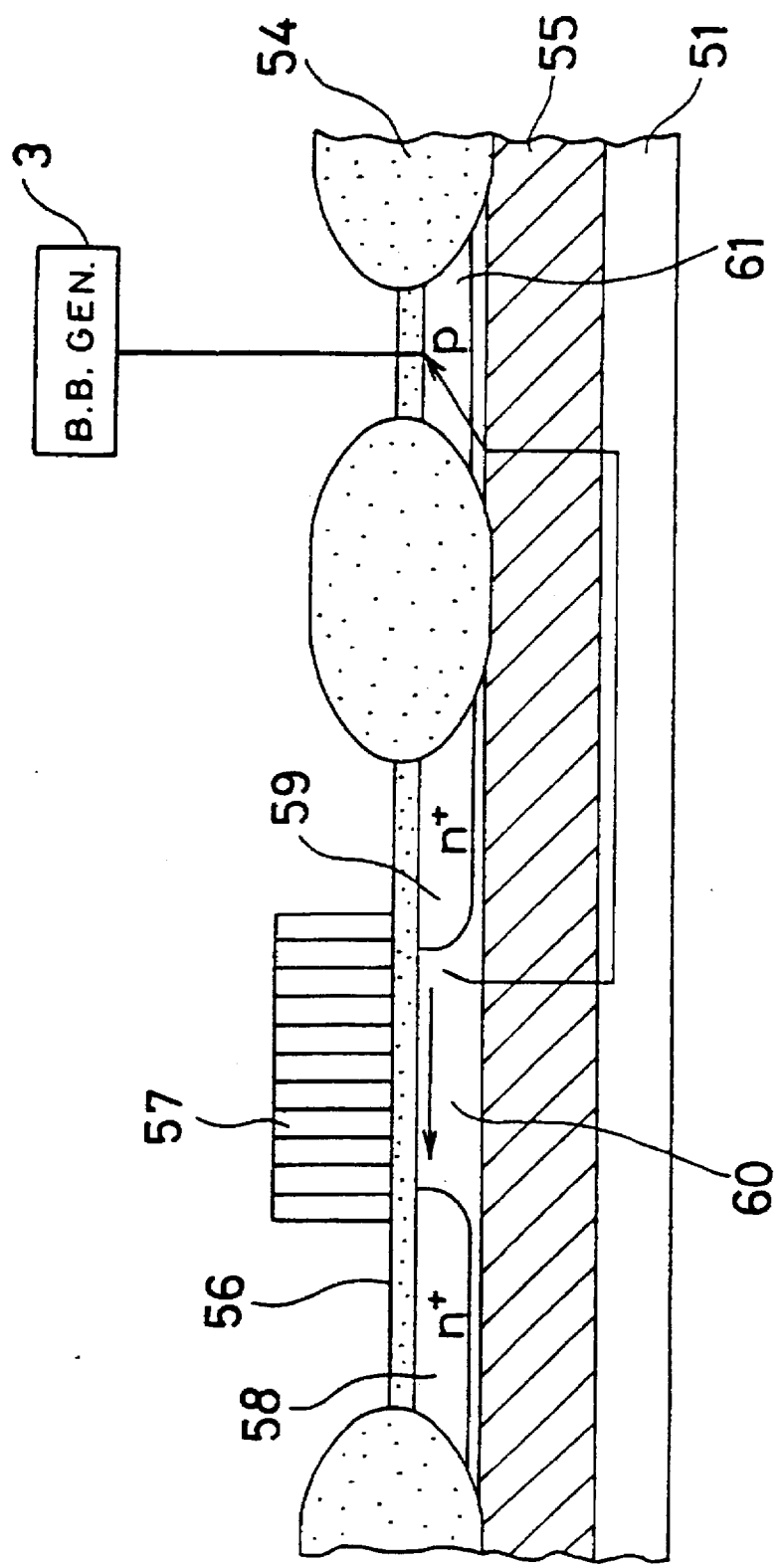

HIGH SPEED MIS-TYPE INTERGRATED CIRCUIT WITH SELF-REGULATED BACK BIAS

BACKGROUND OF THE INVENTION

The present invention relates to a semiconductor apparatus having a semiconductor integrated circuit in which a plurality of MIS transistors are disposed. More particularly, it relates to a method of operating the semiconductor apparatus at high speed with low power consumption.

In general, a MIS transistor is a four-terminal device having a substrate, gate, source, and drain. In the MIS transistor, a threshold voltage, as is defined an applied voltage to the gate terminal required to form a channel, has the characteristic of varying in accordance with a voltage applied to the substrate, i.e., a back bias. FIG. 22 illustrates that the characteristic of a drain current with respect to a general gate-substrate voltage varies in accordance with the back bias. FIG. 28 illustrates the general characteristic of the threshold voltage Vt in accordance with variations in the back bias Vsub. In FIG. 22, a horizontal axis and a vertical axis indicate the gate-substrate voltage Vgs and the drain current Id, respectively, and the gate-substrate voltages Vgs corresponding to open circles are the threshold voltages Vt. As shown in FIGS. 22 and 23, the threshold voltage Vt generally has the characteristic of increasing as the back bias Vsub deepens (moves away from zero). In a MIS transistor of size on the order of submicrons, the power supply voltage is 3.3 V or 5 V and the threshold voltage Vt is normally set to about 0.5 V, while the back bias Vsub is fixed to, e.g., –2 V or 0 V.

To satisfy an increasing demand for a lower-power semiconductor apparatus in recent years, it is effective to reduce the power supply voltage of a semiconductor apparatus. However, since the driving voltage for a transistor, which is a difference between the power supply voltage and the threshold voltage of the transistor, lowers as the power supply voltage lowers, it follows that the reduction in power supply voltage reduces the operating speed of a transistor and of an integrated circuit. To avoid the reduction in the operating speed, it is required to reduce the threshold voltage so that a sufficient driving voltage, which is the difference between the power supply voltage and the threshold voltage, can be obtained. A remarkable improvement in a subthreshold swing parameter, which indicates an I-V characteristic under the threshold-voltage (variations in a gate voltage when a drain current Id changes by one order of magnitude), cannot be expected in principle, however, a characteristic curve shown in FIG. 22 only changes positions to its left adjacent characteristic curve by simply reducing the threshold voltage. Then the drain current Id at the gate voltage Vgs of 0 V, i.e., so-called off-state leakage, increases exponentially, so that a stand-by current is increased, which does not lead to a reduction in power consumption.

There is a disclosed technique for implementing low-power operation in "93 VLSI Circuit Digest" (p.81). According to the technique, an additional circuit is provided in order to vary the back bias and the back bias is substantially set to 0 during the operation of, e.g., a sense amplifier in a DRAM so as to lower the threshold voltage of the transistor, thereby increasing the speed of the sense operation. After the sense operation is completed, the back bias is deepened so as to raise the threshold voltage of the transistor, thereby suppressing the off-state leakage. However, the provision of such an additional control apparatus complicates the circuit, and moreover, extra power is consumed to vary the back bias, so that power consumption may be increased in some cases rather than reduced, although high-speed operation can be expected.

There is disclosed another technique in Japanese Laid-Open Patent Publication No. 63-179576, wherein the source potential with respect to the substrate portion is varied in synchronization with the gate potential so as to lower the threshold voltage of the transistor in the active mode and to raise the threshold voltage of the transistor in the standby mode, thereby achieving the same effects as described in the document mentioned above. However, an additional circuit for varying both potentials in synchronization is also required, so that a sufficient reduction in power consumption may not be attained.

SUMMARY OF THE INVENTION

The present invention has been achieved in view of the fact that the flow of a substrate current has not been utilized conventionally. The present invention therefore utilizes the substrate current in order to attain the lowering of power consumption.

A first object of the present invention is to provide a semiconductor apparatus wherein MIS transistors, of which high-speed operation is required, are disposed and a back bias is applied to the substrate portions of the MIS transistors via resistors, so that the back bias is self-regulated between one value in the active mode and the other value in the standby mode without providing an additional control apparatus, thereby implementing high-speed and low-power operation.

A second object of the present invention is to provide a parameter for attentively control a semiconductor apparatus with a means for detecting the operational mode of a MIS transistor, having different substrate current between in the active mode and in the standby mode, by utilizing the change of the substrate current between the two modes.

To attain the above first object, the principal structure of a semiconductor apparatus according to the present invention comprises: a first-type MIS transistor having a substrate portion, a gate, a source, and a drain; a back-bias generator for generating a back bias to be applied to the substrate portion of the above first-type MIS transistor; and a resistor which is interposed between the substrate portion of the above first-type MIS transistor and the back-bias generator and in which the potential between the both ends thereof changes in a range from one value in the active mode to the other value in the standby mode of the first-type MIS transistor. As a result, the above first-type MIS transistor is constituted so that the back bias is self-regulated to change from one value In the active mode to the other value in the standby mode.

With the above structure, if the first-type, namely the self-regulating back-bias MIS transistor does not operate, the back bias applied to the substrate portion of the transistor deepens (moves away from zero) and the threshold voltage of the transistor is also increased, so that off-state leakage is suppressed. On the other hand, if the first-type MIS transistor operates and the substrate current is allowed to flow, the back bias shallows (approaches to zero) due to the voltage drop caused by the resistor, so that the threshold voltage of the transistor is reduced and high-speed operation is performed. Consequently, a semiconductor apparatus which operates at high speed with low power consumption can be obtained without the provision of any control apparatus.

It is also possible to mount, in the semiconductor apparatus having the above principal structure, a second-type, namely fixed-back-bias MIS transistor having a substrate portion, a gate, a source, and a drain wherein the above substrate portion is connected to the above back-bias generator via a non-resistive wire so that a back bias has a constant value in both the active and standby modes.

With the above structure, the threshold voltage of the second-type MIS transistor is maintained constantly high by preliminarily setting the voltage generated by the back-bias generator at a high value, so that the off-state leakage is suppressed, while a high density is maintained because the resistor is not required. As for the first-type MIS transistor, it achieves the same effects as those achieved by the above invention having the principal structure, thus ensuring high-speed operation and low power consumption. Consequently, the power consumed by the whole semiconductor apparatus is reduced as well as sufficiently high-speed operation and a high density can be implemented.

It is also possible to dispose a plurality of first-type MIS transistors mentioned above so that the substrate portions of the first-type MIS transistors are connected in common to the back-bias generator via a resistor.

In this case, of the plurality of first-type MIS transistors of which the substrate portions are connected in common via the resistor, if some transistors are operating while other transistors are not operating, the back bias of the non-operating transistors also approaches to zero. Although the effect of suppressing the off-state leakage on the transistors in the standby mode is reduced accordingly in the means time, the operating time of transistor is generally much shorter than the non-operating time thereof. Moreover, the current consumed in the active mode is larger than the off-state leakage in the standby mode by at least several orders of magnitude. Consequently, the effect of suppressing power consumption can be achieved to a certain degree by this a simple structure.

In the case where a first-type integrated circuit comprising a plurality of first-type MIS transistors mentioned above is provided, the first-type integrated circuit is preferably a circuit of which high-speed operation is required, such as a sense amplifier, a read amplifier, a column decoder, and a row decoder in DRAM.

In this case, a semiconductor apparatus consuming less power can be obtained without impairing the high-speed operation of these circuits.

In the case where a second-type integrated circuit in which a plurality of second-type MIS transistors are disposed is provided in addition to the above first-type integrated circuit, it is preferable that the first-type integrated circuit is used as a peripheral circuit of a semiconductor memory and that the second-type integrated circuit is used as a memory cell array of the semiconductor memory.

Thus, in the peripheral circuit of which high-speed operation is required, the high-speed operation and low power consumption are ensured. On the other hand, in the memory cell array of which a high density rather than high-speed operation is required, the high density and low power consumption are ensured. Consequently, the functions required of the semiconductor apparatus as a whole are ensured, while power consumption is reduced.

In the case where a plurality of first-type integrated circuits mentioned above are disposed, if the resistance values of the above resistors connected to the substrate portions of the above first-type MIS transistors of the above first-type integrated circuits are individually set in advance, depending on the kinds of the first-type integrated circuits, and if a mean substrate current allowed to flow each of the above first-type integrated circuits is Isumb, the resistance value of each resistor is preferably 0.1/Isubm or more.

Consequently, the back bias of each circuit becomes an appropriate value depending on its function, so that an excellent balance is achieved among the integration, high-speed operation, and low power consumption. Moreover, since the back bias shallows by at least 0.1 V during the operation of the first-type integrated circuit, high-speed operation is ensured.

As the above resistor, it is possible to provide a highly resistive layer in a region under a channel region of at least one first-type MIS transistor and the main body of the substrate.

As a result, a high density is maintained without substantially increasing the area of the semiconductor apparatus for the resistor. Moreover, the parasitic capacitance in the back-bias-changing area which is partitioned by the highly resistive layer is reduced. Consequently, the response of the back bias to the turning-on or off of the transistor is improved so that the transistor operates at higher speed.

In this case, it is also possible to form an isolating layer composed of an insulator between at least the channel-side corner of the source/drain of the first-type MIS transistor and the highly resistive layer.

Consequently, the parasitic capacitance between the source/drain and the substrate is minimized. As a result, the operation speed of the self-regulating back-bias MIS transistor is significantly increased, while power consumption is greatly reduced.

The above highly resistive layer can be formed easily in the semiconductor substrate from a semiconductor material having the same conductivity type as that of the substrate and characteristics similar to those of an intrinsic-type semiconductor.

In the case of using a SOI substrate as the semiconductor substrate, the above highly resistive layer can be formed by causing crystal defects in the insulator of the SOI substrate.

In the above semiconductor apparatus having the principal structure, it is possible to provide at least one normally-on transistor as a resistor.

Consequently, it becomes possible to manufacture the self-regulating back-bias transistor by a conventional process of manufacturing transistors, since it is not necessary to form a resistor by depositing a material other than the material composing the transistor.

To attain the above first object, the present invention provides a method of operating a semiconductor apparatus comprising a MIS transistor having a substrate portion, a gate, a source, and a drain, which comprises the steps of generating a constant voltage and applying the above constant voltage to the substrate portion of the above MIS transistor via a path having a high resistance value.

To attain the above second object, the present invention provides a method of operating a semiconductor apparatus comprising a MIS transistor having a substrate portion, a gate, a source, and a drain, a back-bias generator to be applied to the substrate portion of said MIS transistor, and a resistor interposed between the substrate portion of said MIS transistor and the back-bias generator so that the potential between the both ends thereof changes in a range from one value in the active mode to the other value in the standby mode of the MIS transistor, which comprises the steps of: estimating the value of a substrate current based on the potential difference between the both ends of said resistor; and judging whether said MIS transistor is in the active mode or in the standby mode.

By this method, it becomes possible to recognize the operation of the transistor by utilizing the substrate current in controlling the MIS transistor in which the back bias is self-regulated, thereby implementing attentive control.

The semiconductor apparatus is controlled so that the power supply voltage is reduced in the circuit block containing the MIS transistor in which the estimated value of the substrate current reaches a specified value or lower or that the circuit block in question is disconnected from the power source.

By this method, a waste of power such as leakage is suppressed by lowering the power-supply voltage in the circuit block containing a MIS transistor in the standby mode, thereby reducing power consumption.

BRIEF DESCRIPTION OF THE DRAWINGS

FIG. 1 is a circuit diagram of a semiconductor apparatus according to a first embodiment;

FIG. 2(a) is a view diagrammatically showing a MIS transistor in the standby mode and in the active mode, and FIGS. 2(b) and 2(c) are views showing a substrate current and back bias of the MIS transistor which change between the standby mode and the active mode;

FIGS. 18(a) to 18(d) are cross-sectional views showing the transition of the substrate for the N-channel MIS transistor of self-regulating back-bias type according to an eighth embodiment in its manufacturing process;

FIG. 19 is a cross-sectional view showing an example of the structure for the self-regulating back-bias transistor composed of a partially depleted SOI transistor according to an eighth embodiment;

FIG. 28 is a view showing a threshold value voltage which varies in accordance with variations in back bias of the general MIS transistor.

DETAILED DESCRIPTION OF THE PREFERRED EMBODIMENTS

Figure 3:
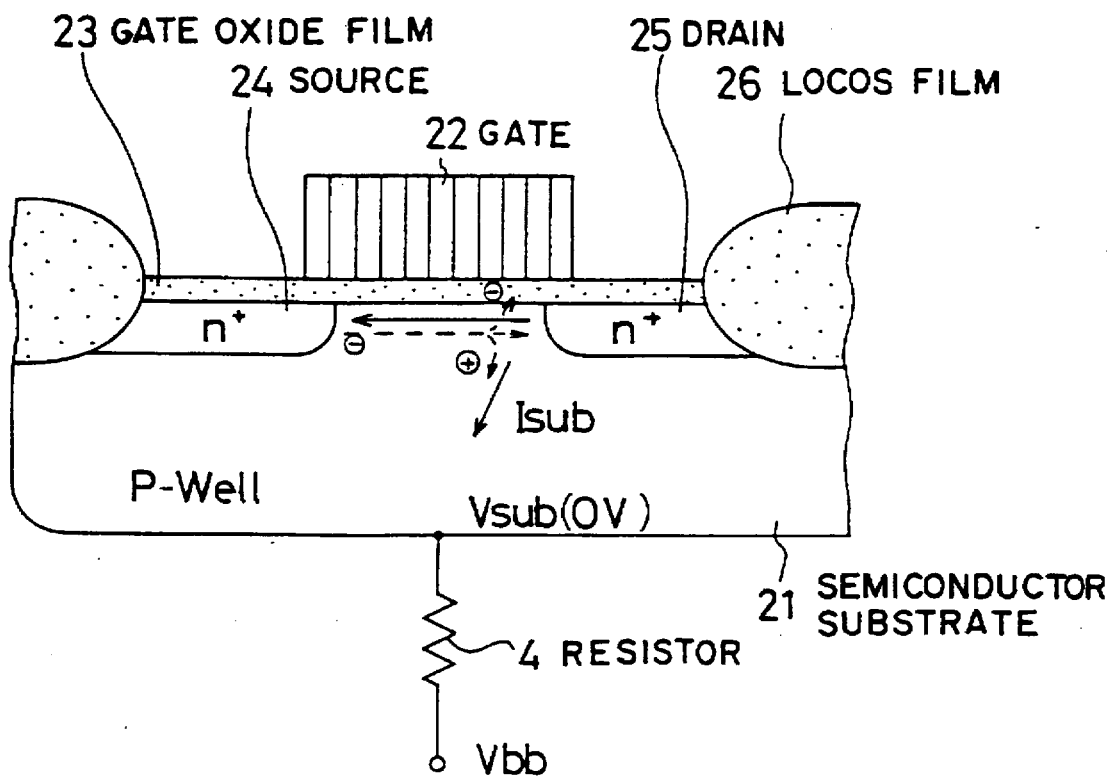
FIG. 3 is a cross-sectional view of a self-regulating back-bias MIS transistor (a first-type MIS transistor) according to a first embodiment, which illustrates a fundamental mechanism in which the substrate current is generated.

Below, the embodiments of a semiconductor apparatus in which self-regulating back-bias MIS transistors of the present invention are disposed will be described with reference to the drawings.

(First Embodiment)

A description will be given first to a first embodiment with reference to FIGS. 1 to 5. FIG. 1 shows the structure of a DRAM serving as a semiconductor apparatus according to the first embodiment. In the drawing, a reference numeral 1 designates a cell array in which a plurality of memory cells, each containing a MIS transistor, are disposed. A large number of MIS transistors 10a, 10b, ... disposed in the cell array 1 are of fixed-back-bias type (second-type MIS transistors). A reference numeral 2 designates a sense amplifier for amplifying a signal in reading the content of a memory in the memory cell array 1. In the sense amplifier 2 are disposed a large number of self-regulating back-bias MIS transistors 20a, 20b, ... (first-type MIS transistors). A reference numeral 3 designates a back-bias generator for the MIS transistors in the foregoing memory cell array 1 and sense amplifier 2. The back-bias generator 3 is connected with the individual substrate portions of the fixed-back-bias transistors 10a, 10b, ... in the foregoing memory cell array 1 by a connecting wire 6, while it is connected with the individual substrate portions of the self-regulating back-bias MIS transistors 20a, 20b, ... in the foregoing sense amplifier 2 by a connecting wire 5.

The present invention is characterized in that the connecting wire 5 between the foregoing back-bias generator 3 and the individual substrate portions of the self-regulating back-bias MIS transistors 20a, 20b, ... in the sense amplifier 2 is intervened by a resistor 4 composed of a material having a high electrical resistance. On the other hand, the individual substrate portions of the fixed-back-bias MIS transistors 10a, 10b, . . . in the foregoing cell array 1 are connected directly to the back-bias generator 3 with the connecting wire 6 which is not intervened by a resistor. In particular, the connecting wire is a non-resistive wire of conductive material that does not generate resistance. In other words, the foregoing sense amplifier 2 is a self-regulating back-bias integrated circuit and the memory cell array 1 is a fixed-back-bias integrated circuit. Although the MIS transistors 10a, 10b, . . . in the foregoing memory cell array 1 and the MIS transistors 20a, 20b, . . . in the sense amplifier 2 are formed in the same semiconductor substrate, the substrate of the cell array 1 is electrically isolated from that of the sense amplifier 2 by forming a well having a conductivity type opposite to substrates of the cell array 1 and the sense amplifier 2 in the surroundings of one or both of the cell array 1 and the sense amplifier by introducing so-called "triple well".

FIG. 3 shows the structure of the foregoing self-regulating back-bias MIS transistor. In the drawing, a reference numeral 21 designates a semiconductor substrate, 23 designates a gate oxide film, 24 designates a source, 25 designates a drain, and 26 designates a LOCOS film. To the semiconductor substrate 21 is applied a back bias Vbb via a resistor 4 having a resistance value of Rext. As shown in FIG. 3, if a current is allowed to flow from the drain 25 to the source 24 (see the solid lines in the drawing), electrons are allowed to flow from the source 24 at a potential of 0 V to the drain 25 at a potential of, for example, 5 V and then abruptly accelerated in a high-field channel region (normally at an intermediate potential of about 3 V) in the vicinity of the drain, so that they collide with the grid of the semiconductor substrate 21, thereby generating hot electron-hole pairs. These hot electrons are attracted by the gate 22, while the hot holes are allowed to flow to the semiconductor substrate 21 at a lower potential, thereby generating a substrate current Isub which causes a difference in potential between the both ends of the resistor 4.

FIGS. 2(a) to 2(c) show the transistor 20, the substrate current Isub of the transistor, and the back bias Vbb of the transistor, respectively, which are changing between the active mode and the standby mode. As described above, if the self-regulating back-bias MIS transistors 20a, 20b, . . . are in the active mode (to the right of the timing t2 in FIGS. 2(b) and 2(c)), the potential difference (2 V) is generated between the both ends of the resistor 4, so that the back bias Vsub approaches to zero accordingly (0 V). On the other hand, if the MIS transistors 20a, 20b, . . . are in the standby mode (to the left of the timing t1 in FIGS. 2(b) and 2(c)), the substrate current Isub is not allowed to flow, so that the back bias Vsub deepens accordingly (−2 V). Thus, the MIS transistor 20 is constituted so that the back bias Vsub changes between one value in the active mode and the other value in the standby mode. A time constant RC required for the transistor to switch between the active mode and the standby mode is extremely small, as will be described later, so that the provision of such a resistor does not adversely affect the operation of the transistor. As will be described later, the threshold voltage lowers in the active mode due to the back bias approaching to 0, so that high-speed operation can be expected. On the other hand, the threshold voltage increases in the standby mode due to the deepening back bias, so that off-state leakage is suppressed.

Figure 4:
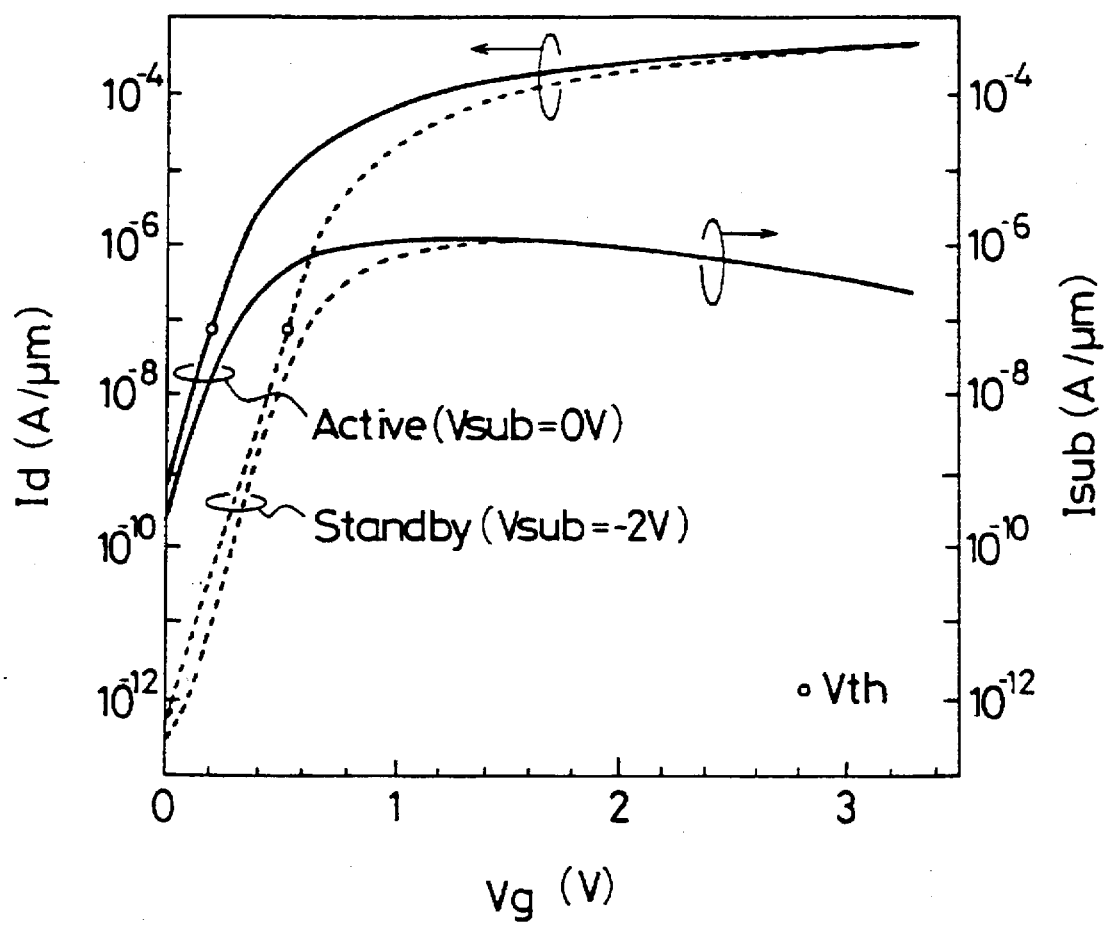
FIG. 4 is a view showing the characteristics of a drain current and of the substrate current which vary in accordance with a gate-substrate voltage in the MIS transistor of the first embodiment in the active and standby modes.
Figure 5:
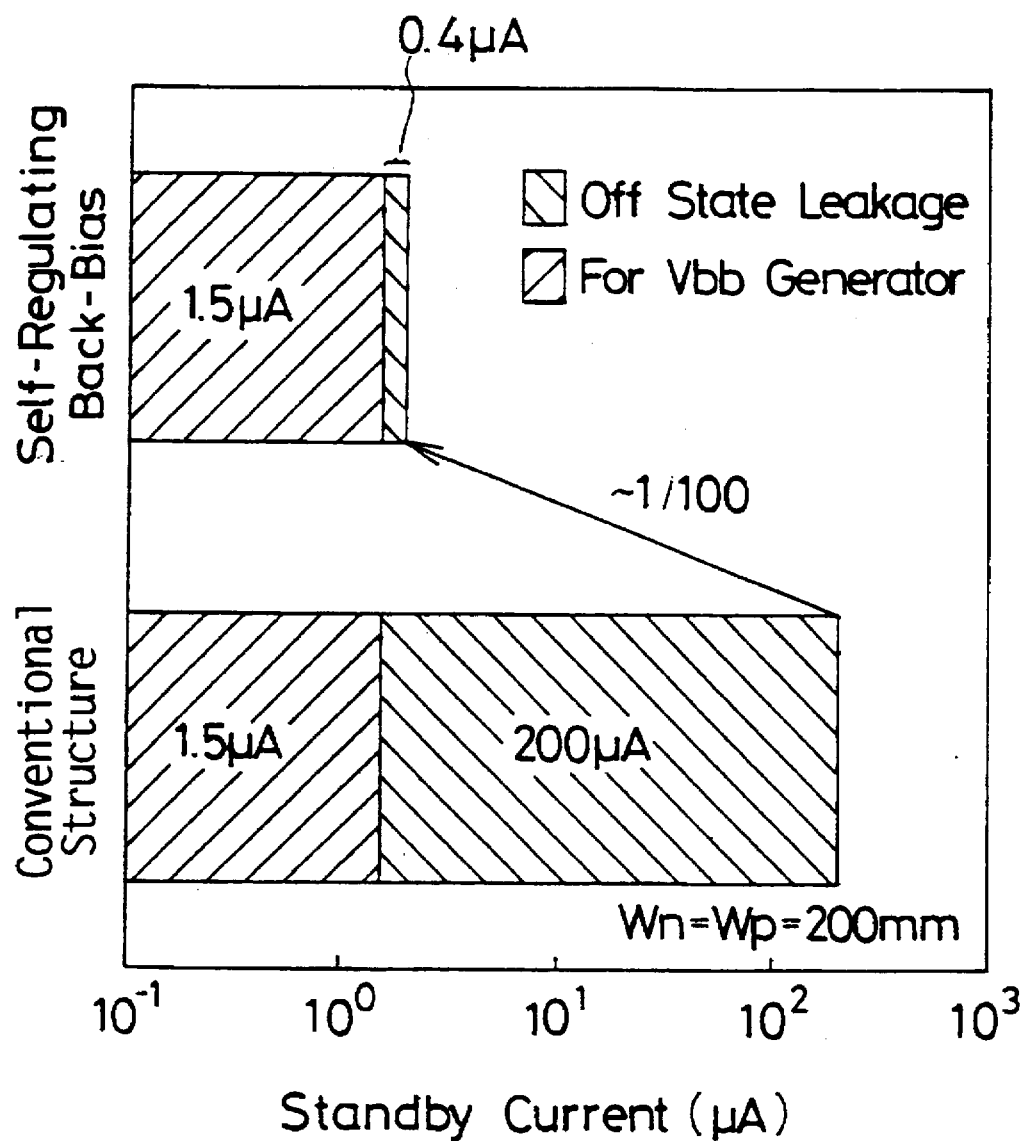
FIG. 5 is a view showing a comparison of a standby current in the case of applying the structure of the self-regulating back-bias MIS transistor to an N-channel transistor with that in the case of simply setting the threshold voltage of an N-channel transistor to a small value according to a conventional method.

Below, a description will be given to the switching of the back bias between one value in the active mode and the other value in the standby mode of the foregoing self-regulating back-bias MIS transistor and to the effect of lowering power consumption achieved by the self-regulating back-bias MIS transistor. FIG. 4 shows the dependence of the drain current Id and substrate current Isub of the self-regulating back-bias MIS transistor on the gate voltage Vg. In the "Active" mode indicated by a solid line in the drawing, the back bias Vsub becomes 0 V, thereby lowering the threshold voltage. In the "Standby" mode indicated by a broken line in the drawing, the back bias Vsub deepens to −2 V, thereby raising the threshold voltage. FIG. 5 shows a comparison of a standby current which is calculated on the assumption that the total gate width of each of N-channel and P-channel transistors is 200 mm in a self-regulating back-bias MIS transistor obtained by applying the structure of FIG. 3 to an N-channel transistor with that in a MIS transistor of conventional structure in which the threshold voltage of an N-channel transistor is simply set to a small value. The standby current is defined as the sum of the current supplied to the back-bias generator and the off-state leakage current. As can be appreciated from the drawing, although the currents supplied to the back-bias generators in both MIS transistors are substantially the same, the off-state leakage currents are remarkably different, so that the standby current in the self-regulating back-bias MIS transistor is reduced significantly. It will be appreciated that the standby current has been greatly reduced by about two orders of magnitude, while maintaining high-speed operation due to the low threshold voltage.

Figure 6:
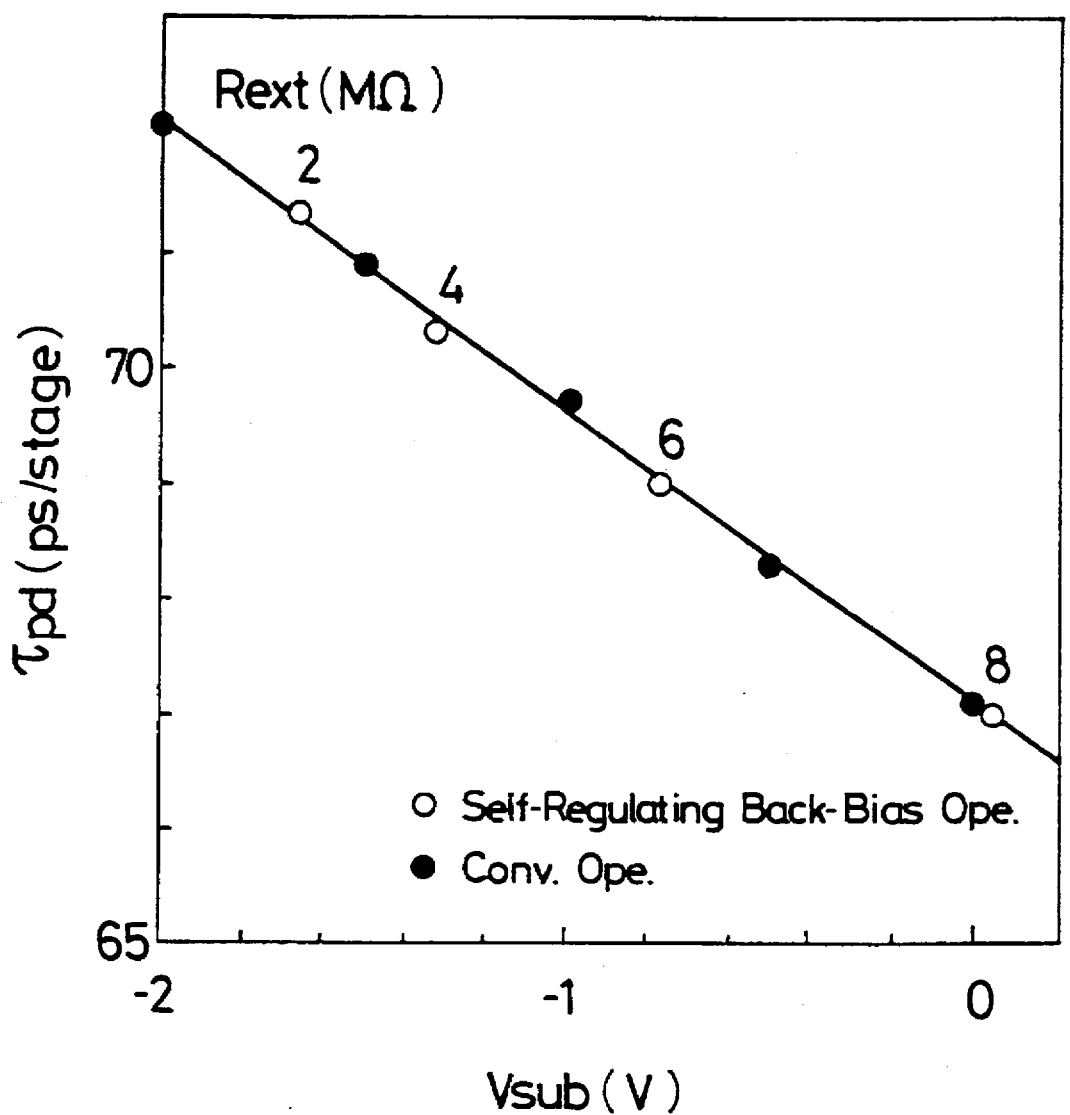
FIG. 6 is a view showing the dependence of a delay time τpd on a substrate voltage Vsub in a CMOS ring oscillator consisting of the self-regulating back-bias MIS transistor and a fixed-back-bias transistor.

FIG. 6 shows the measurement of delay time τpd per CMOS inverter when the self-regulating back-bias MIS transistors is applied to N-channel transistor of a ring oscillator. Here, the operating voltage is 2.5 V and the voltage Vbb applied to the substrate of the self-regulating back-bias MIS transistor is −2 V. The ring oscillator with the conventional fixed-back-bias MIS transistors has the characteristic that the delay time τpd decreases substantially linearly with the changing of the back bias Vsub, as indicated by solid circles in the drawing. In the ring oscillator with the self-regulating back-bias MIS transistor, on the other hand, the delay time τpd decreases along the same line obtained by connecting the solid circles, as indicated by hollow circles in the drawing, by adjusting the resistance value Rest of the resistor (in this case, the resistance value is changed to 2, 4, 6, and 8 MΩ). Hence, it will be appreciated that, with the provision of the resistor, the effect of changing the back bias is solely obtained without causing any adverse effect. The back bias Vsub can be adjusted easily and successfully only by changing the resistance value of the resistor, so that higher-speed operation of the ring oscillator can be implemented by the changing of the back bias Vsub. Since at least one pair of CMOS inverters are in the transient state at a given instant in the ring oscillator, the substrate current is allowed to flow constantly. Therefore, the use of the structure of the self-regulating back-bias MIS transistor will achieve a great effect. This also indicates that, even in an integrated circuit wherein a large number of devices are disposed, a similar effect can be obtained since any of the devices is always in the transient state.

In the first embodiment described above, since the common resistor 4 is provided for the back-bias generator 3 and the individual transistors 20a, 20b, . . . in the sense amplifier 2 composed of a self-regulating back-bias circuit, all the potentials of the substrate portions of the individual transistors in the sense amplifier 2 become equal during the operation of the sense amplifier 2. As a result, even when a certain transistor is in the standby mode, if another transistor is in the sense amplifier 2 in the active mode, the off-state leakage current is allowed to flow to some extent in the mean time. However, compared with the drain current Id in the active mode, the off-state leakage current is extremely small (at least by several orders of magnitude). Moreover, the back bias deepens if all the transistors $20a$, $20b$, . . . in the sense amplifier 2 are turned OFF, so that the effect of reducing the standby current can be obtained sufficiently.

If it is assumed that the individual transistors $20a$, $20b$, . . . in the sense amplifier 2 are formed by setting the output of the back-bias generator 3 to $-2$ V and the resistance value R of the resistor 4 to 10 k$\Omega$ in accordance with the following conditions, the surface area of a P-well/substrate junction becomes 10400 $\mu m^2$ and the total well capacitance C, which is defined as the sum of the source-drain junction capacitance and the P-well/N-substrate junction capacitance becomes 600 fC.

| | |
|---|---|
| Mean Substrate Current Isub: | 0.2 mA |
| P-Well Impurity Concentration | 4E16 cm$^{-3}$ |
| P-Well Size: | 100 × 100 $\mu m^2$ |
| P-Well Depth: | 1 $\mu m$ |
| Impurity Density of N-substrate: | 1E15 cm$^{-3}$ |
| P-Well/N-Substrate Junction Capacitance: | 0.05 fF/$\mu m^2$ |
| Source/Drain-P-well Junction Area: | 200 $\mu m^2$ |
| Source-Drain Junction Capacitance: | 0.4 fF/$\mu m^2$ |

Under the foregoing conditions, the back bias Vsub of the transistor in the active mode is represented by the following equation $$Vsub = -2 + Isub \cdot R \cdot e^{-(t/RC)}.$$

In this case, $Isub \cdot R = 2$ (V) is derived from the foregoing conditions. Since the time constant RC becomes about 6 nsec, even in extremely high-speed operation where the operating time of the sense amplifier is 10 nsec, e.g., the back bias changes to about 0 V ($= -2 + Isub \cdot R$) within the operating time of the sense amplifier, which is exceedingly effective.

Consequently, it may be considered that, for a self-regulating back-bias circuit, a circuit in which high-speed operation is required, such as the sense amplifier of the DRAM of the foregoing embodiment 1, a read amplifier, a column decoder, or a row decoder, is appropriate. It is also possible to apply the structure of the self-regulating back-bias circuit to a reference-voltage generator for generating a low voltage.

Although the foregoing embodiment has used the MIS transistors, it will easily be appreciated that the present invention is also applicable to a transistor in which the gate insulating film is composed of a nitride oxide film and the like. In other words, the present invention is applicable to MIS transistors of all types. If the latch-up immunity becomes a problem in a CMOS circuit or the like, it is preferable to apply the structure of the self-regulating back-bias MIS transistor to an N-channel transistor. If the latch-up immunity presents no problem because of a low power supply voltage, on the other hand, the structure of the self-regulating back-bias MIS transistor is applicable to a P-channel transistor. With the structure having the enhanced latch-up immunity, which will be described later, it is possible to apply the structure of the self-regulating back-bias transistor of the present invention to various transistors whether they are N-channel or P-channel transistors.

(Second Embodiment)

Next, a second embodiment will be described with reference to FIG. 7.

Figure 7:
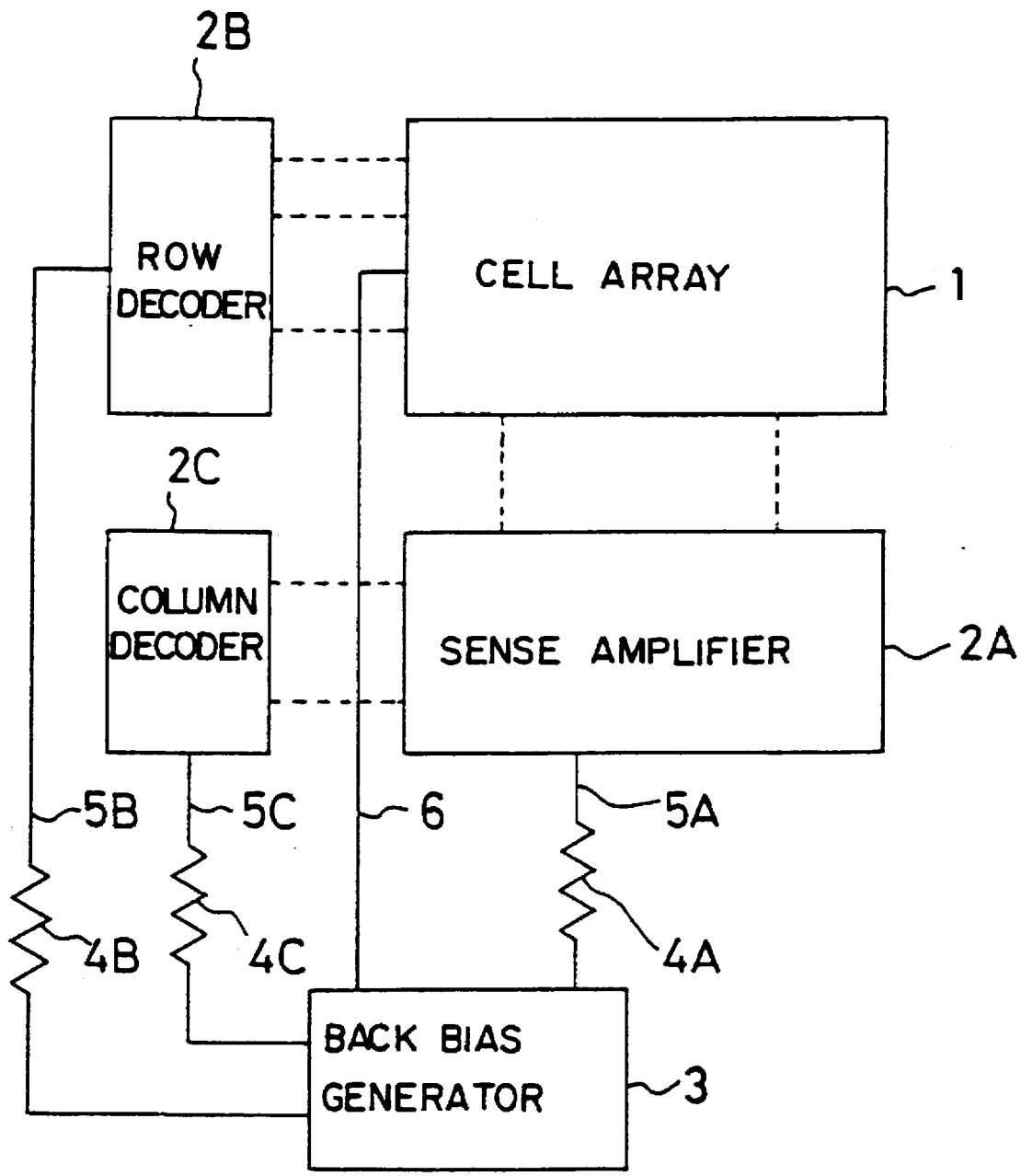
FIG. 7 is a block diagram showing the structure of the semiconductor apparatus according to a second embodiment.

FIG. 7 is a view diagrammatically showing the structure of a DRAM serving as the semiconductor apparatus according to the second embodiment. As shown in the drawing, a sense amplifier 2A, a row decoder 2B, a column decoder 2C, and the like in the present embodiment are a plurality of self-regulating back-bias integrated circuits, while the cell array 1 is a fixed-back-bias integrated circuit. Paths 5A, 5B, and 5C which connect the substrate portions of MIS transistors (not shown) in the individual circuits 2A, 2B, and 2C to the back-bias generator 3 are intervened by resistors 4A, 4B, and 4C, respectively.

In general, currents IcA, IcB, and IcC consumed by the sense amplifier 2A, row decoder 2B, and column decoder 2C, respectively, have a relationship of IcA>>IcB, IcA>>IcC (IcB is substantially equal to IcC) among them (when the current IcA consumed by the sense amplifier 2A is about 20 mA, e.g., each of the current IcB consumed by the row decoder 2B and the current IcC consumed by the column decoder 2C is about 1 mA). If it is assumed that mean substrate currents flowing through the respective integrated circuits in operation are IsubmA, IsumB, and IsubmC, the relationship of IsubmA>>IsubmB, IsubmA>>IsubmC (IsubmB is substantially equal to IsubmC) is established among them. On the basis of these current values, the resistance value Rn (n=A, B, C, . . . ) of each of the above resistors 4A, 4B, and 4C was preliminarily set to a value equal to or more than (0.1/Isub), depending on their types. Thus, by making the back bias approach to zero by at least 0.1 V or more, high-speed operation and lower power consumption are implemented.

In the normal operation of the DRAM, the row decoder, sense amplifier, and column decoder are sequentially activated at different times, instead of being activated at once. Consequently, by disposing the resistors in the respective circuit blocks isolated with each other, the operations of the individual circuit blocks can be controlled independently so that higher-speed operation and lower power consumption can be ensured.

(Third Embodiment)

Figure 8:
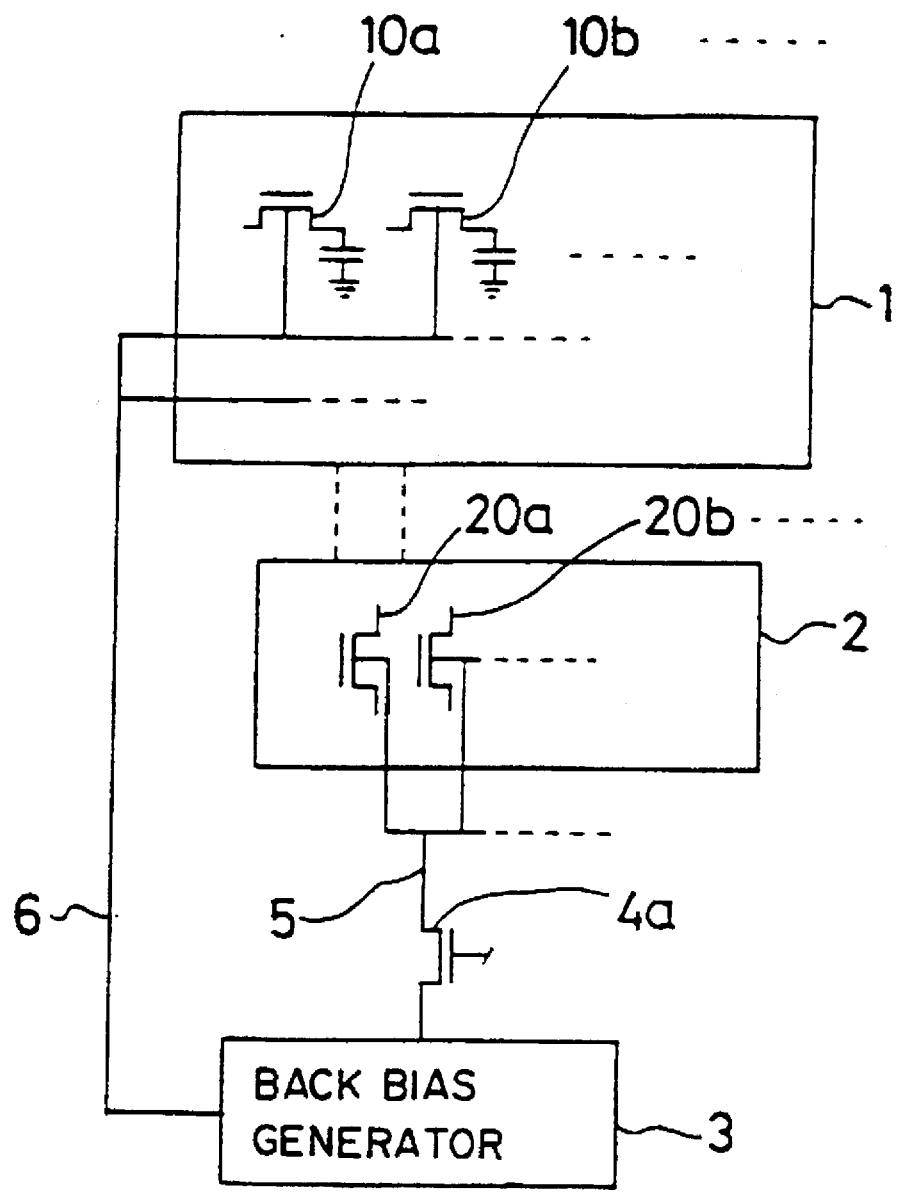
FIG. 8 is a block diagram showing the structure of the semiconductor apparatus according to a third embodiment.

Next, a third embodiment will be described with reference to FIG. 8. FIG. 8 shows the structure of the semiconductor apparatus according to the third embodiment, the basic structure of which is substantially the same as that of the semiconductor apparatus according to the above first embodiment. In the present embodiment, however, the connecting wire 5 between the substrate portions of the MIS transistors $20a$, $20b$, . . . In the self-regulating back-bias integrated circuit 2 and the back-bias generator 3 is intervened by a normally-on transistor $4a$ as a resistor. That is, since a bias corresponding to the power-supply voltage is constantly applied to the gate of the normally-on transistor, on-resistance, i.e., the drain voltage with respect to the drain current Vd/Id is increased by increasing the gate length or by reducing the gate width, so that the normally-on transistor functions as a resistor, thereby omitting a step of separately depositing a material with high resistance.

Although a single normally-on transistor is disposed as a resistor in the above third embodiment, the present invention is not limited to the embodiment. It will easily be appreciated that a plurality of normally-on transistors may be connected in series or in parallel so as to intervene the connecting wire. By disposing the plurality of normally-on transistors, the resistance of the resistor can be set to various values depending on the function of the integrated circuit in question.

(Fourth Embodiment)

Figure 9:
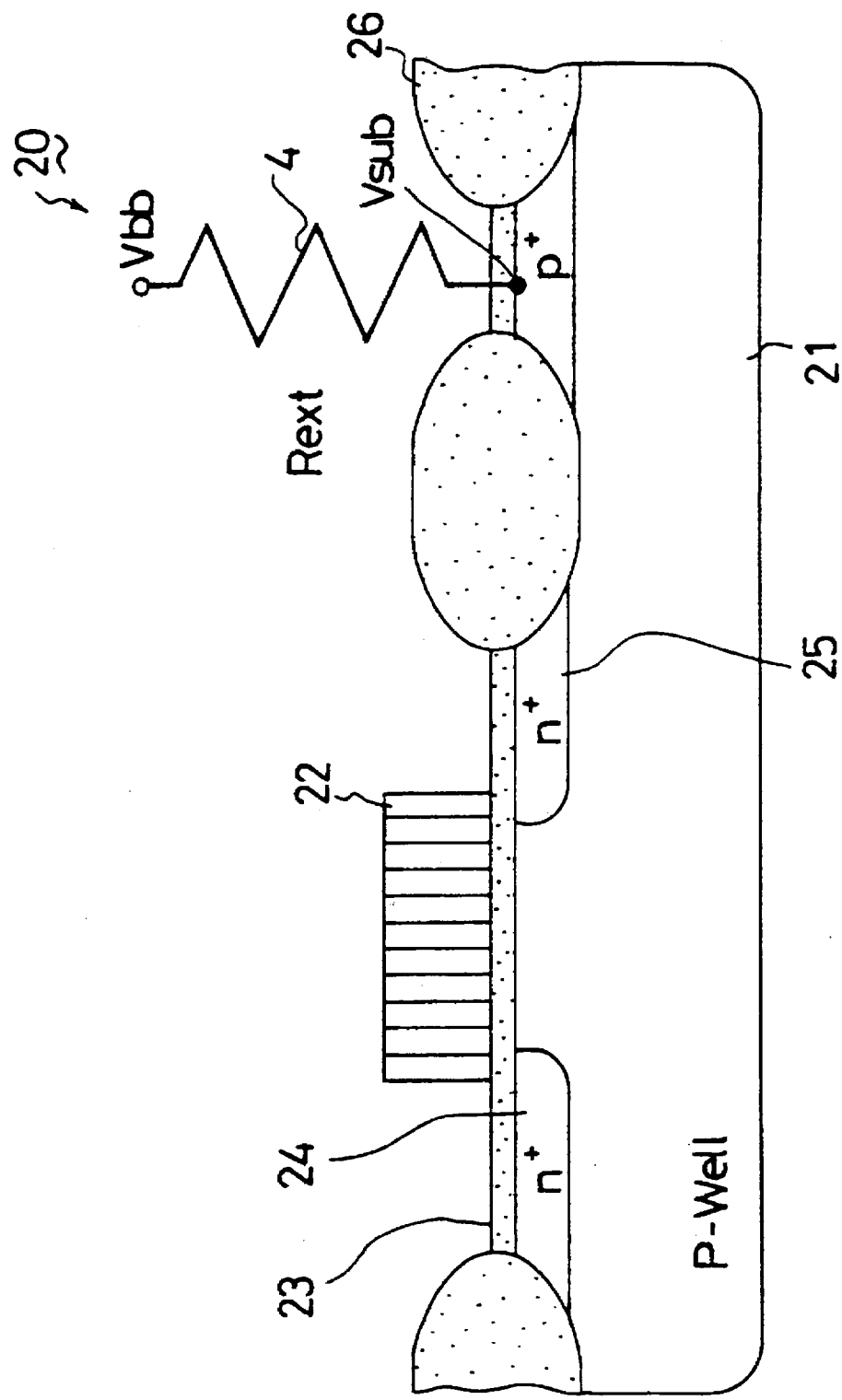
FIG. 9 is a cross-sectional view of the self-regulating back-bias structure applied to an individual MIS transistor.

The above first to third embodiments have described the cases where the self-regulating back-bias MIS transistors are primarily applied to the circuit blocks. If the back bias can change in response to the substrate current in the midst of turning-on of the transistor, characteristics superior to those obtained in the above embodiments can be obtained. FIG. 9 is a view diagrammatically showing the cross-sectional structure of a self-regulating back-bias MIS transistor 20 which is constituted so that the back bias can change independently. In the drawing, a reference numeral 21 designates the semiconductor substrate, 23 designates the gate oxide film, 24 designates the source, 25 designates the drain, and 26 designates the LOCOS film. To the semiconductor substrate 21 the back bias Vbb via the resistor having the resistance value Rext is applied. When a current is Isub allowed to flow, a potential difference Isub·Rext is generated between the both ends of the resistor 4, whereby the back bias Vsub becomes closer to zero than it is in the standby mode.

Figure 10:
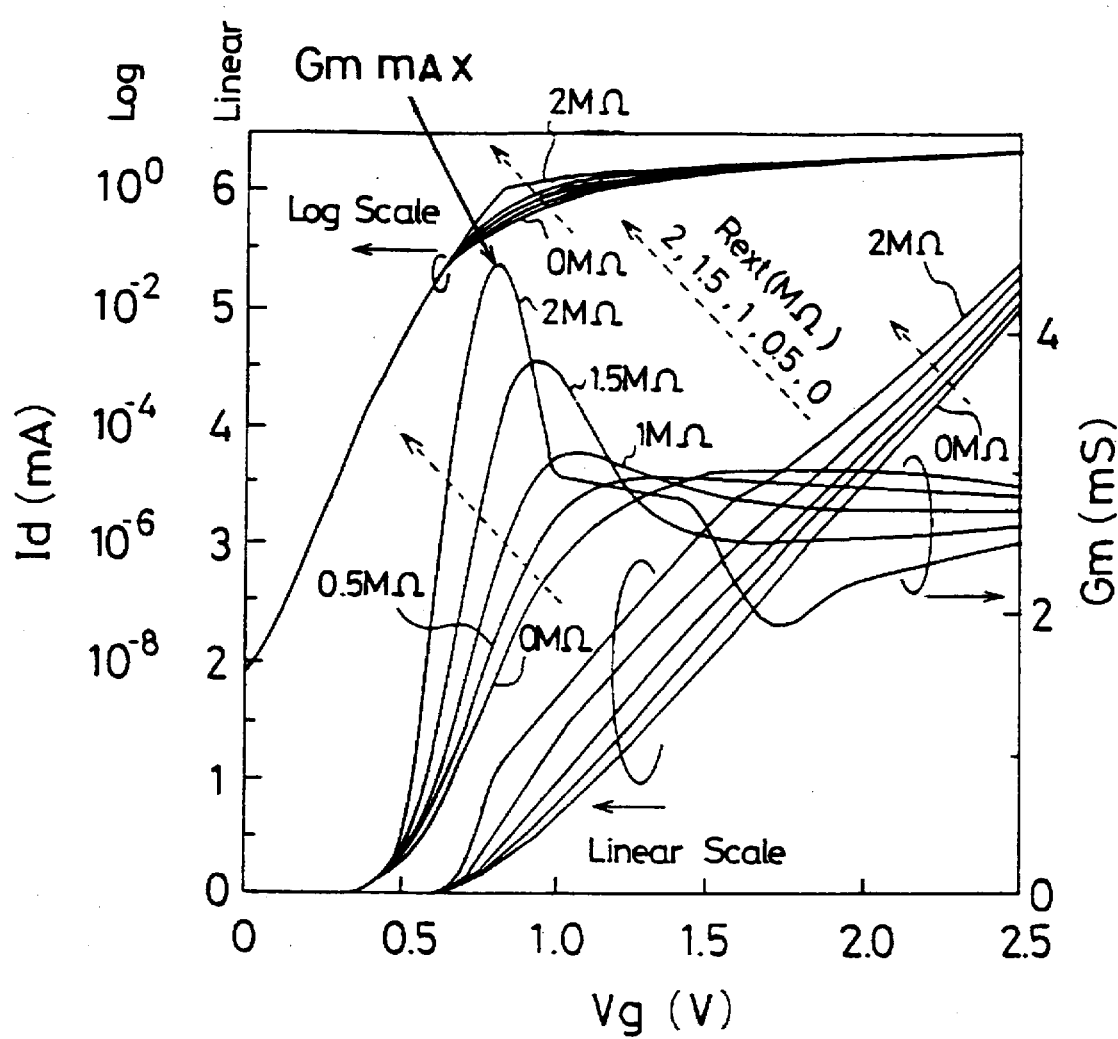
FIG. 10 is a view showing the results of the dependence of the measured current-voltage characteristic and transconductance of the self-regulating back-bias transistor on the back bias and on the resistance of a resistor.
Figure 11:
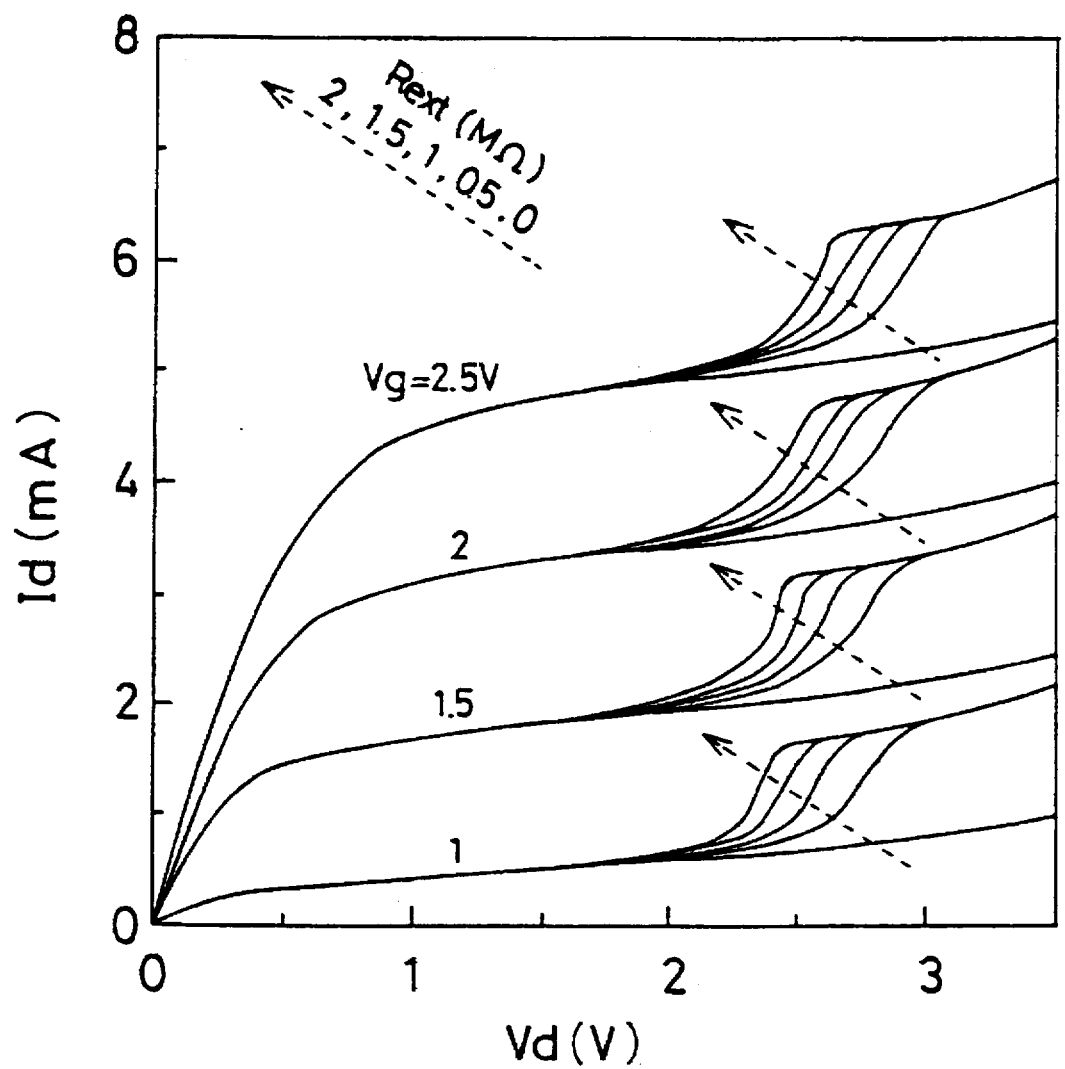
FIG. 11 is a view showing the dependence of the measured saturation-current characteristic of the self-regulating back-bias transistor on the resistance value.

FIGS. 10 and 11 show the dependence of measured current-voltage characteristics, transconductances, and saturation current characteristics in the case of sweeping at a comparatively low speed (about 1 V/s) on the resistance value of the resistor so that the back bias Vsub follows the substrate current Isub. In the drawings, the individual characteristic curves in the order indicated by the short dashed arrow show the characteristics of transistors having resistance values Rext of 0, 0.5, 1, 1.5, 2 MΩ, respectively, of which the characteristic curves having the resistance value Rext of 0Ω show the characteristics of the conventional fixed-back-bias MIS transistors. In FIG. 10, the vertical scale indicating the drain current Id on the left consists of the log scale and linear scale. The vertical scale is for clearly showing the differences in drain current Id between the fixed-back-bias MIS transistors and the self-regulating back-bias MIS transistors. As shown in FIG. 11, in contrast to the structure of the conventional fixed-back-bias MIS transistors, not only the drain current but also the maximum transconductance Gmmax are improved, while maintaining the subthreshold characteristics under the threshold voltage. In the transistor S in which the resistance value of the resistor is 2 MΩ, e.g., the drain current is improved by about 1 mA (at Vg>1 V) and the maximum transconductance Gmmax is improved by about 50% (see FIG. 10), compared with the transistor having the resistance value of 0Ω, which is the conventional fixed-back-bias transistor. Such a behavior is also observed in a thin film SOI and the like and termed "kink effect", which cannot be controlled easily. However, in the self-regulating back-bias MIS transistor, the degree of an increase in current can be controlled spontaneously with the resistance value of the highly resistive layer (see FIG. 11). If the time constant RC upon the changing of the substrate potential Vsub becomes smaller than the time required for turning-on of the MIS transistor in the real circuit operation (normally 50 to 500 ps), the structure of the self-regulating back-bias MIS transistor can be used independently in each MIS transistor. Since the MIS transistor, particularly in a CMOS circuit, is often used in the vicinity of the maximum transconductance Gmmax, a further improvement of circuit performance can be expected due to the improved Gmmax.

Figure 12:
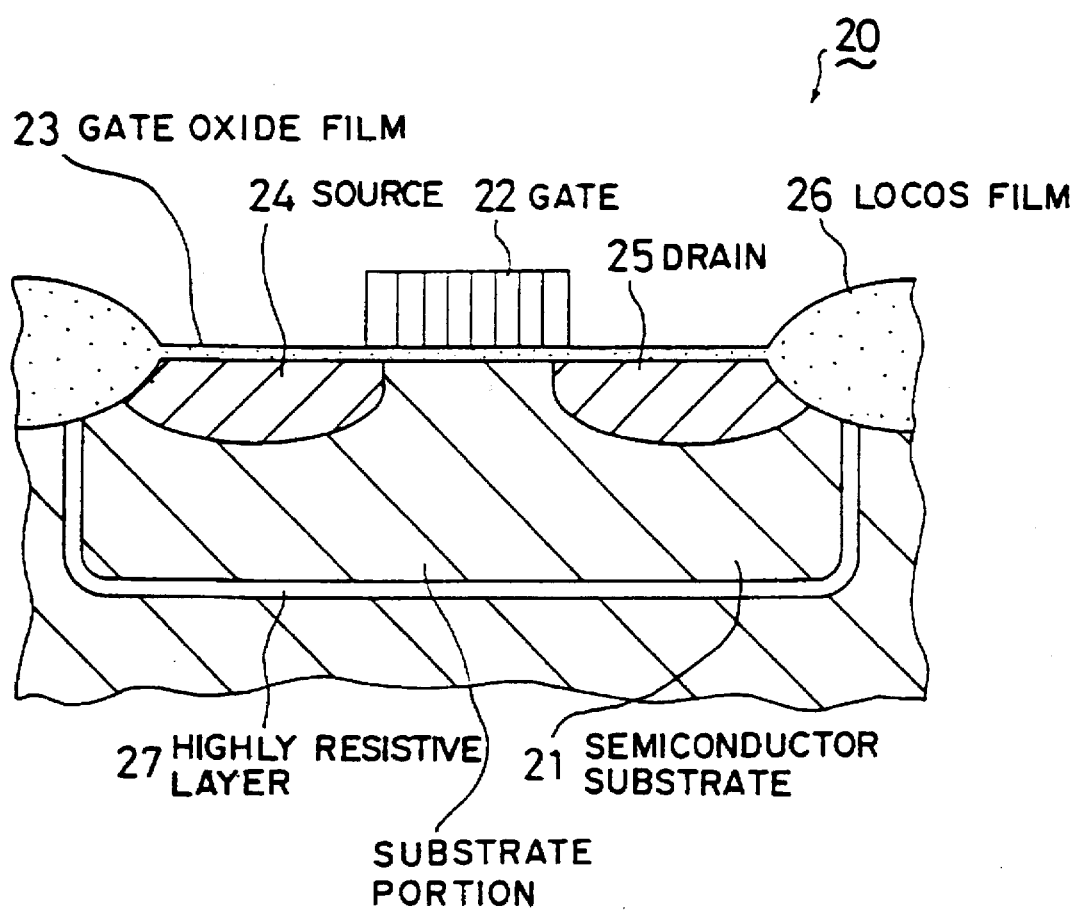
FIG. 12 is a cross-sectional view showing an example of the structure of the self-regulating back-bias transistor according to a fourth embodiment.

Next, a description will be given in the present fourth embodiment to an example of the structure of the transistor into which the resistor is incorporated. FIG. 12 shows the example of the structure, in which the gate 22 is formed on the semiconductor substrate 21 with the gate oxide film 23 interposed therebetween. In the surface region of the semiconductor substrate 21 are formed the source 24 and drain 25 by doping the regions located on the sides of the gate 22 with an impurity at high concentration. A reference numeral 26 designates the LOCOS film for isolating the active region of the MIS transistor from other regions. Deep into the semiconductor substrate 21 is formed the highly resistive layer 27 composed of a thin film having high resistance. The highly resistive layer 27 is buried in the substrate so as to surround the substrate portion of at least one MIS transistor 20.

The highly resistive layer 27 can be formed relatively easily, for example, from a semiconductor material which has the same conductivity type as that of the substrate and which is similar to an intrinsic-type semiconductor material. Thus, by constituting the resistor by the highly resistive layer 27 buried in the substrate so as to surround the MIS transistor, the resistor can be formed advantageously without substantially changing the real area of the integrated circuit. Moreover, since the region in which the back bias is changed (active-well, region) becomes comparatively small, the parasitic capacitance is also reduced in the region, thereby advantageously suppressing the time constant to a smaller value. The highly resistive layer 27 is also effective in the first to third embodiments if it is constituted so as to surround each specified circuit block or the whole integrated circuit, not each MIS transistor as in the present fourth embodiment.

(Fifth Embodiment)

Figure 13:
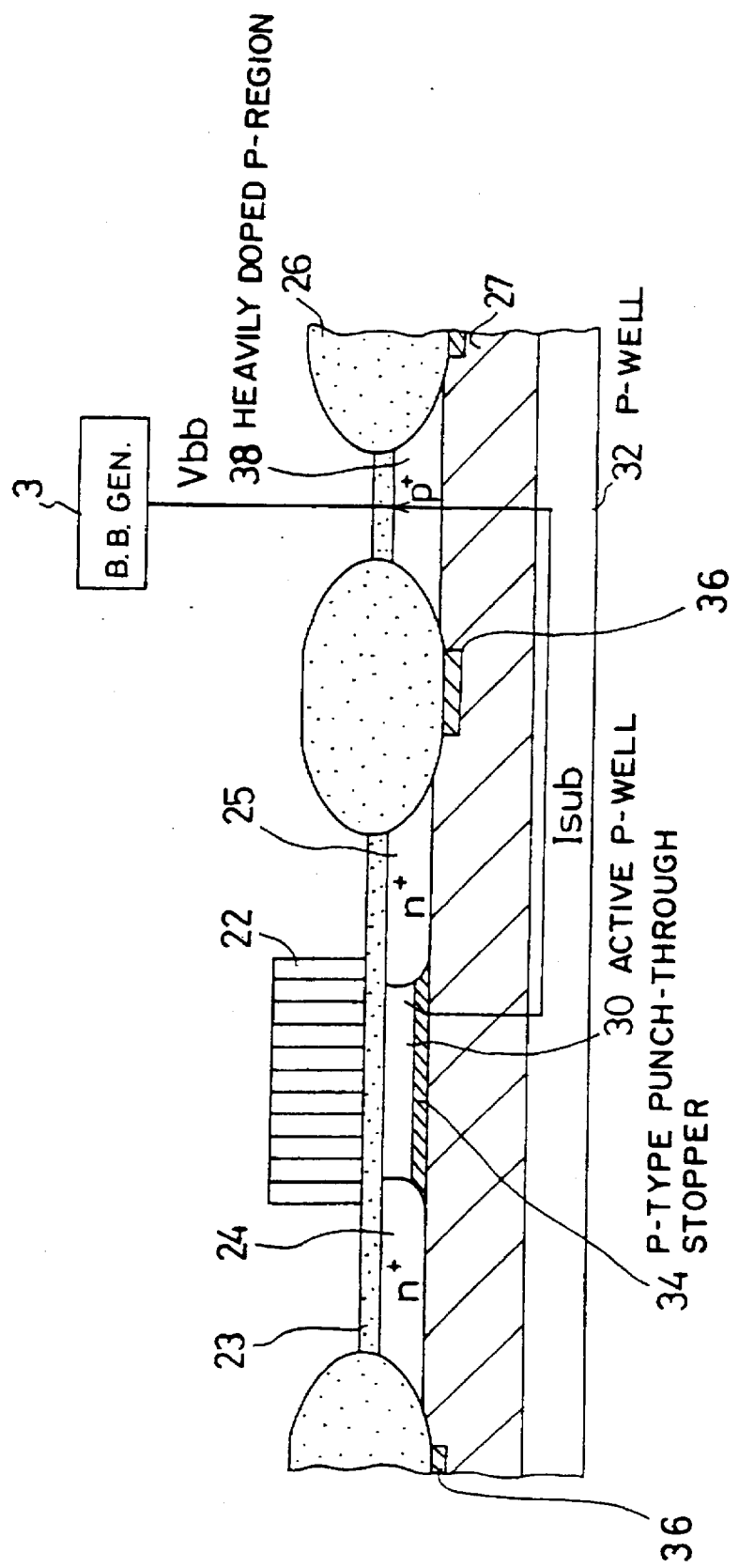
FIG. 13 is a cross-sectional view of an N-channel MIS transistor of self-regulating back-bias type according to a fifth embodiment.

Next, a fifth embodiment will be described with reference to FIG. 13 and FIGS. 14(a) to 14(e). In the present embodiment, a description will be given to a structure for reducing the parasitic capacitance of the active well. FIG. 13 shows the structure of a self-regulating back-bias N-channel MIS transistor in which the highly resistive layer 27 is formed in the vicinity of the source/drain. FIGS. 14(a) to 14(e) are cross-sectional views showing the transition of the substrate structure in the manufacturing process in the case where the self-regulating back-bias structure is applied to an N-channel transistor and to a P-channel transistor.

As shown in FIG. 13, the basic structure of the MIS transistor is the same as the structure of the MIS transistor according to the fourth embodiment shown in FIG. 12. Each MIS transistor is constituted so that the back bias thereof changes independently in a self-regulating manner. In the present embodiment, however, the highly resistive layer 27 is formed so as to extend vertically from a position shallower than the bottom position of the LOCOS film 26 to a position deeper than the foregoing position by a specified depth and horizontally over the self-regulating back-bias MIS transistors in a plane parallel to the substrate surface. The back-bias generator 3 is connected to a heavily doped P-region 38 between the LOCOS films 26. Generally, the substrate current Isub successively flows through the active P-well region 30 under the gate 22, the highly resistive layer 27, a P-well 32, and a heavily doped P-region 38 as result. The MIS transistor is constituted so that the back bias shallows in the active mode with the substrate current Isub flowing through the highly resistive layer 27. A reference numeral 34 designates a P-type punch-through stopper.

Next, a description will be given to a process of manufacturing the self-regulating back-bias MIS transistor having the structure of FIG. 13 with reference to FIGS. 14(a) to 14(e).

Figure 14:
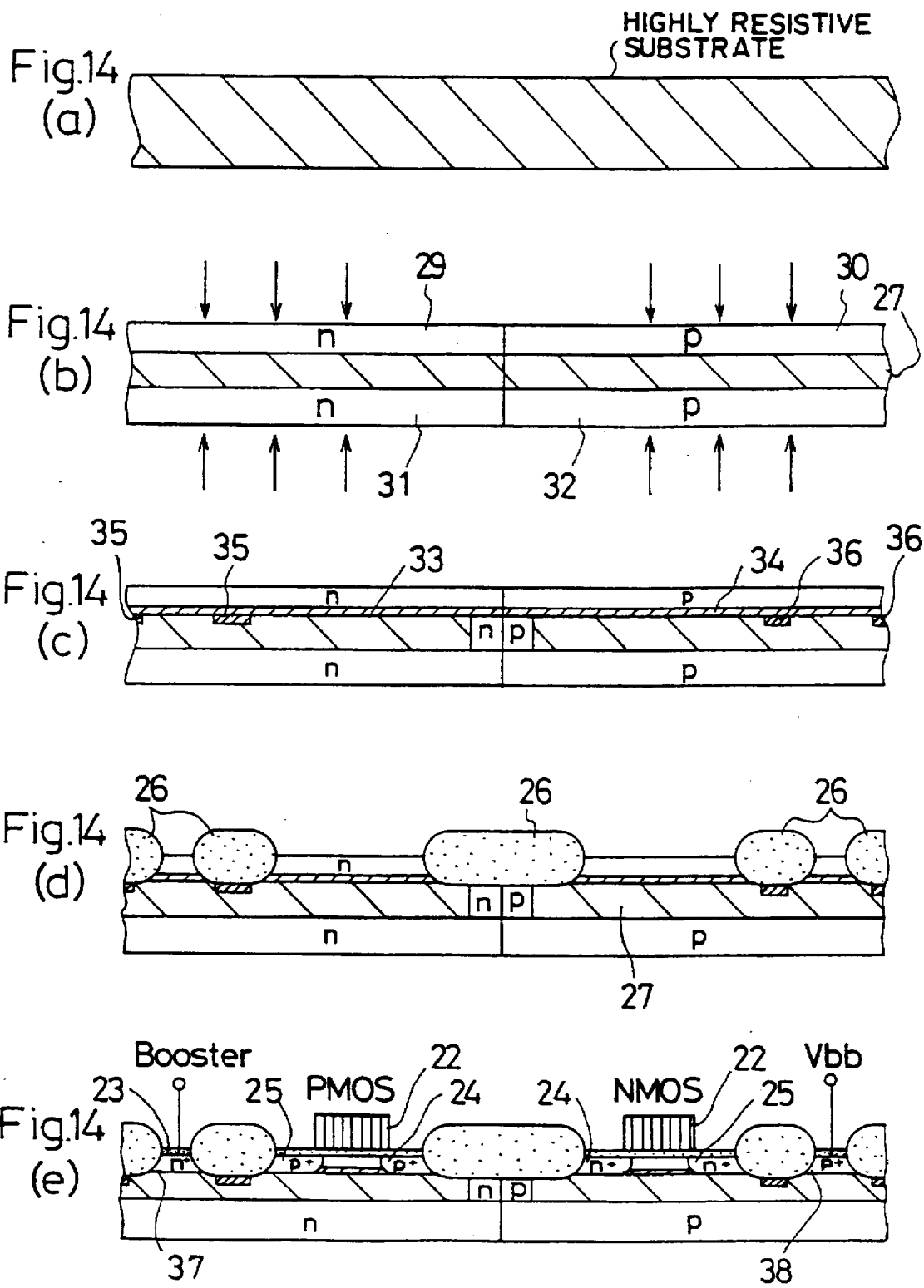
FIGS. 14(a) to 14(e) are cross-sectional views showing the transition of the substrate for the N and P-channel MIS transistor of self-regulating back-bias type according to the fifth embodiment in its manufacturing process.

First, a highly resistive substrate is prepared from an Intrinsic-type semiconductor material (see FIG. 14(a)). The surface region of the highly resistive substrate is divided into two regions and an N-type impurity and a P-type impurity are introduced into the respective regions by ion implantation, so that an active N-well 29 and the active P-well 30 are formed by the subsequent diffusion of the impurities. On the other hand, an N-type impurity and P-type impurity are introduced into the highly resistive substrate from their back surfaces by ion implantation, so that an N-well 31 and a P-well 32 are formed in the region below the active N-well 29 and in the region below the active P-well 30, respectively, by the subsequent diffusion of the impurities. After the ion implantations performed from the top surface and from the back surface, the implanted impurities are thermally diffused, so that the highly resistive layers 27 composed of a substantially intrinsic-type semiconductor material remain between the active well 29 and well 31 and between the active well 30 and well 32 (see FIG. 14(b)), respectively. However, since the diffused impurities reach the highly resistive layer 27 in the process of diffusing the impurities, the highly resistive layer 27 located between the active N-well 29 and the N-well 31 contains a small amount of N-type impurity, while the highly resistive layer 27 located between the active P-well 30 and the P-well 32 contains a small amount of P-type impurity.

Next, the ion implantation of an N-type and P-type impurities respectively at high concentration is performed from above the active N-well 29 and the ion implantation of a P-type impurity at high concentration is performed from above the active P-well 30, so that an N-type punch-through stopper 33 is formed immediately above the active N-well 29 and that the P-type punch-through stopper 34 is formed immediately above the active P-well 30. In the vicinity of the boundary between the active wells 29 and 30, an N-type channel stopper 35 for isolation and a P-type channel stopper 36 for isolation are formed by increasing the concentrations of the impurities in the respective active wells (see FIG. 14(c)). In the vicinity of the boundary between the active N-well 29 and the active P-well 30 and the like is formed the LOCOS films, the bottom portions of which reach the highly resistive layers 27 (see FIG. 14(d)).

Next, the gate oxide film 23 is formed over the entire surface of the substrate, and then the gate 22, source 24, and drain 25 are formed. Above the active N-well 29 and the active P-well 30 are formed a PMOS transistor and an NMOS transistor, respectively. In this case, a heavily doped N-region 37 for contact with the booster for the PMOS transistor is formed simultaneously with the formation of the source and drain of the NMOS transistor. On the other hand, a heavily doped P-region 38 for contact with the back-bias generator (Vbb) for the NMOS transistor is formed simultaneously with the formation of the source and drain of the PMOS.

The present embodiment thus constituted provides the following effects in addition to the same effects as obtained in the above fourth embodiment: since the highly resistive layer 27 is in contact with the source/drain, the capacitance between the bottom portions of the source/drain and the substrate, which mainly accounts for the parasitic capacitance of the active well regions 29 and 30, is reduced to a negligible value, so that the parasitic capacitance of the active well regions 29 and 30 is greatly reduced.

In the self-regulating back-bias integrated circuit, it is not necessary to compose all the MIS transistors of the self-regulating back-bias transistors. The self-regulating back-bias integrated circuit may contain the fixed-back-bias transistor.

(Sixth Embodiment)

Next, a sixth embodiment will be described with reference to FIGS. 15 and 16.

Figure 15:
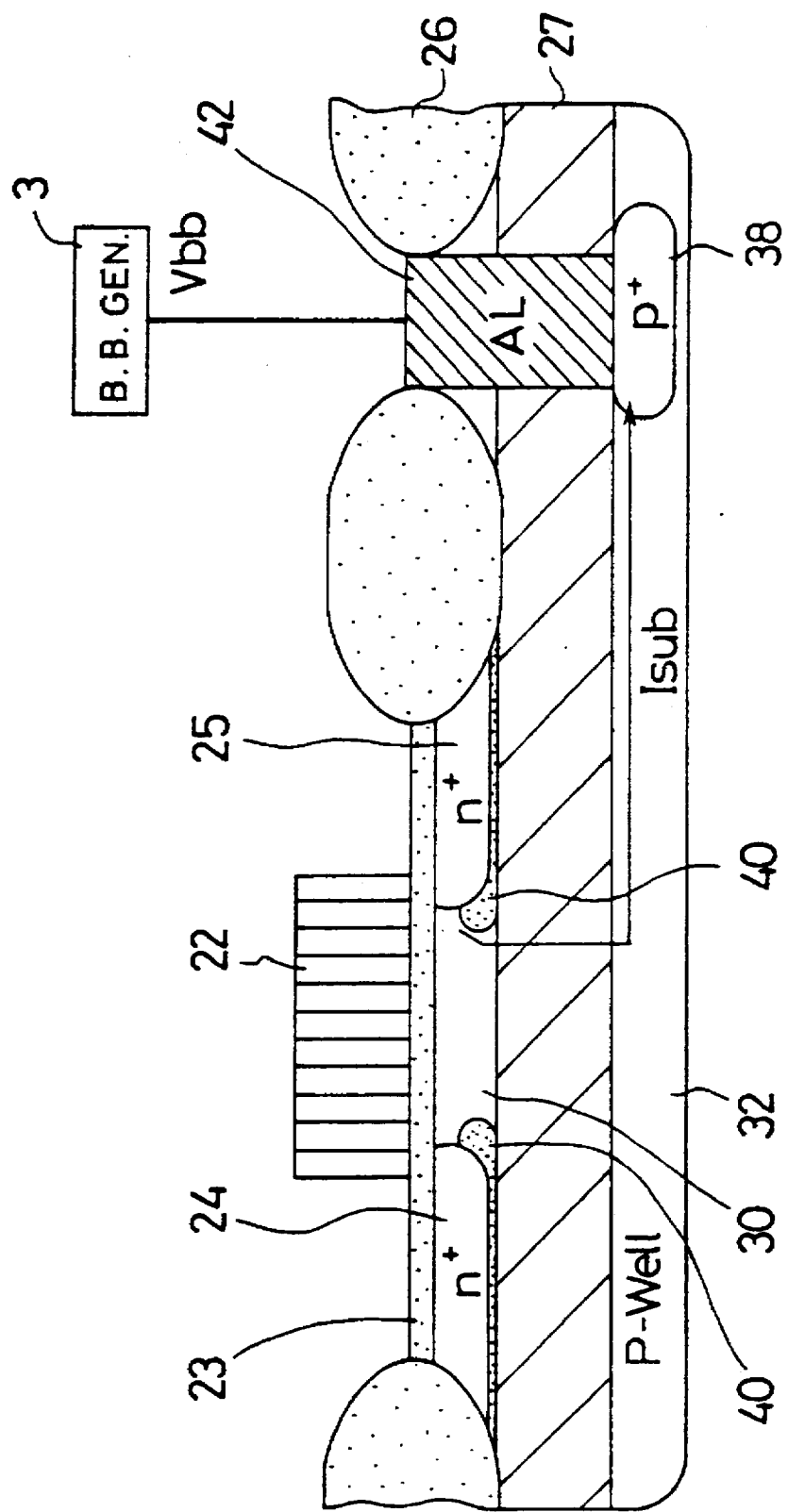
FIG. 15 is a cross-sectional view showing an example of the structure of the N-channel MIS transistor of self-regulating back-bias type according to a sixth embodiment.

FIG. 15 shows the structure of a self-regulating back-bias NMOS transistor according to the sixth embodiment, in which isolation layers 40 are formed from silicon dioxide films between the source 24/drain 25 and the highly resistive layer 27. In that region of the P-well 32 which is located immediately below the highly resistive layer 27, a heavily doped P-region 38 into which a P-type impurity at high concentration has been implanted is formed between the two LOCOS films 26. An electrode 42 composed of an Al alloy is formed thereon over the entire surface of the substrate. Except for that, the structure of the present embodiment is substantially the same as the structure of the fifth embodiment.

Figure 16:
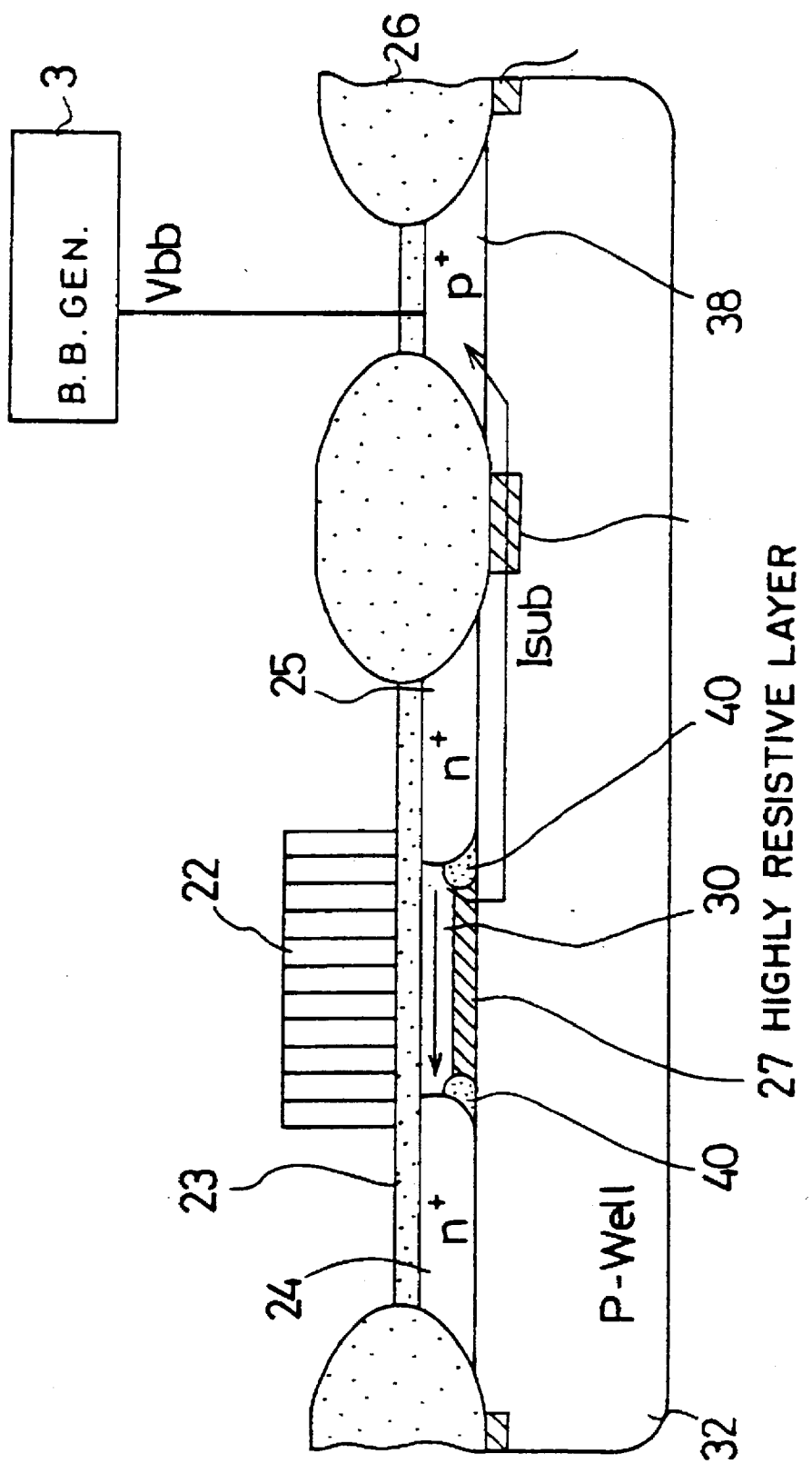
FIG. 16 is a cross-sectional view showing another example of the structure of the self-regulating back-bias MIS transistor according to the sixth embodiment.

FIG. 16 shows another example of the structure of the self-regulating back-bias NMOS transistor according to the present embodiment. In this case, the thin highly resistive layer 27 is formed between the active P-well 30 and the P-well 32. Moreover, the isolation layers 40 composed of silicon dioxide films are formed on the boundary of the three portions, which are P-well 32, highly resistive layer 71, and source 24/drain 25.

With the structures of FIGS. 15 and 16, it is possible to suppress the punch-through between the source and drain, while reducing the parasitic capacitance of the active well region 30, by forming the isolation layer 40 at least at the channel side corner of the source/drain (or in the bottom portions of the source/drain) by, e.g., implanting oxygen ions after the formation of the gate, so that the structures are suitable for miniaturization. In particular, the potentials of the individual wells are fixed similarly to the conventional embodiment, thereby achieving a remarkable effect that the latch-up immunity is not lowered even if CMOS circuits are formed by the P-channel and N-channel MOS transistors constituted by the self-regulating back-bias transistors.

The structure shown in FIG. 15 is particularly advantageous in that the provision of a channel stopper can be omitted, since the improvement of withstanding voltage of isolation can be expected.

(Seventh Embodiment)

Next, a seventh embodiment will be described.

Although the back bias has been directly changed by utilizing the substrate current Isub in the first to sixth embodiments, it is possible to obtain the similar effects from the structure of the self-regulating back-bias MIS transistor which is provided with an additional circuit for monitoring the substrate current Isub by utilizing the potential difference between the both ends of the resistor connected to the substrate, so as to change the back bias indirectly. In this case, however, the additional circuit is required. The idea leads to various control which can be performed by monitoring the back bias.

Figure 17:
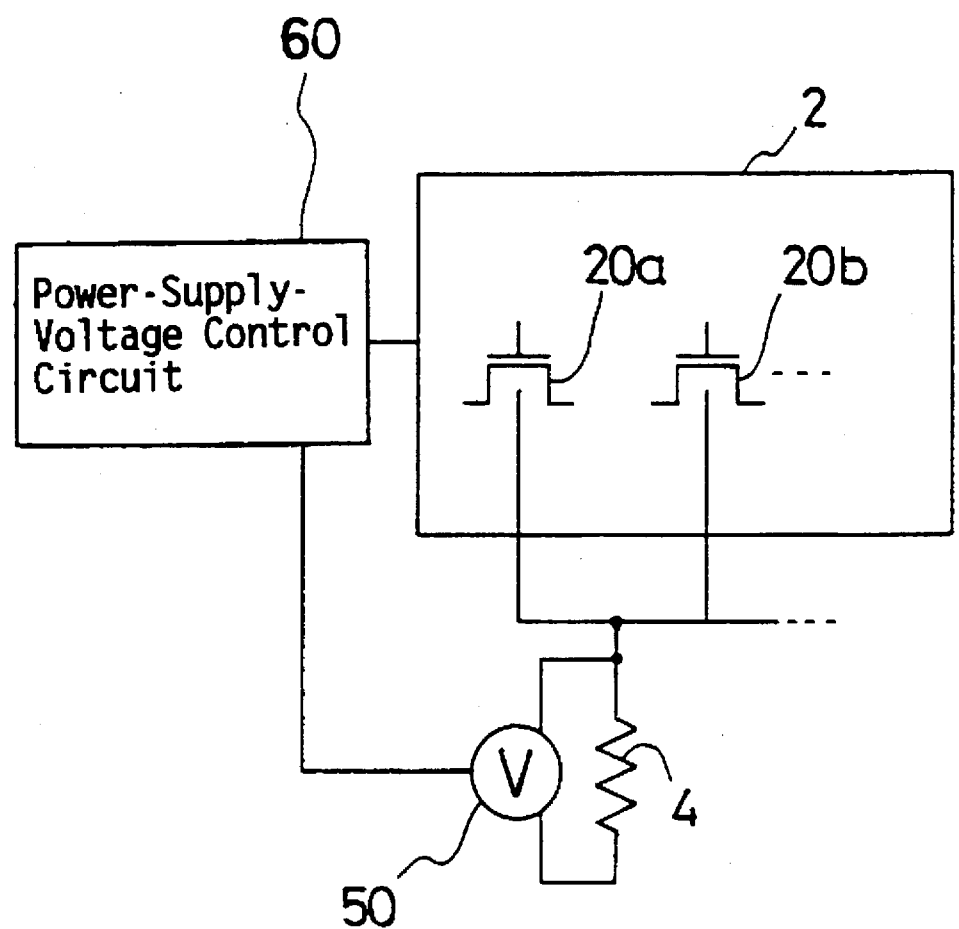
FIG. 17 is a block diagram illustrating a method of operating the self-regulating back-bias MIS transistor according to a seventh embodiment.

As shown in FIG. 17, e.g., it is possible to estimate the substrate current in the circuit block 2 in which the self-regulating back-bias MIS transistors 20a, 20b, . . . are disposed by means of a voltage monitor 50 so that the operation of the circuit block 2 can be controlled by a power-supply-voltage control circuit 60 utilizing the estimated value. For example, it is possible to reduce power consumption by placing a circuit block, in which the substrate current Isub reaches a specified value or lower, in the standby mode so that the power source voltage therein is lowered or by disconnecting the circuit block from the power source.

(Eighth Embodiment)

Next, an eighth embodiment of the self-regulating back-bias transistor composed of an SOI transistor will be described with reference to FIGS. 18(a) to 18(d).

Although the highly resistive layer is formed from a substantially intrinsic-type semiconductor material in each of the above fifth and sixth embodiments, the highly resistive layer in the present embodiment is obtained by causing a large number of crystal defects in the oxide film of the SOI transistor.

First, as shown in FIG. 18(a), a SOI substrate 51 is prepared by forming a silicon dioxide film 52, which is an insulator, on a P-type semiconductor substrate 51 and then forming a P-well 53 composed of a single-crystal silicon film on the silicon dioxide film 52. Next, as shown in FIG. 18(b), a LOCOS film 54 is selectively formed so that a part of the P-well 53 functions as an active region. Next, as shown in FIG. 18(c), a resist mask 70 having a slit over a part of the active region is formed on the SOI substrate 51, so that $Si^+$ ions are implanted in the silicon dioxide film 52 through the slit. In this case, the implantation of $Si^+$ ions into the silicon dioxide film 52 is limited to the region underlying the slit. The implanted $Si^+$ ions cause a large number of crystal defects inside the silicon dioxide film 52, so that parts of the silicon dioxide film 52, which is an insulator, become highly resistive layers 55a and 55b. After that, as shown in FIG. 18(d), a gate oxide film 56, a gate electrode 57, a source 58, and a drain 59 are formed. The P-well portion between the source 58 and drain 59 serves as an active well 60, while the P-well portion, to which a connecting wire from the back-bias generator is attached, serves as a contact region 61.

In addition to a high mobility and a low subthreshold parameter which are characteristic of the SOI transistor, the structure shown in FIG. 18(d) has another advantage in successfully suppressing the occurrence of the kink effect resulting from the floating substrate, which is a disadvantage of the SOI transistor. Consequently, the advantages of the self-regulating back-bias transistor are made the best use of.

The P-type substrate can be a N-type substrate and the contact region 61 can be a $n^+$ region. Although the silicon dioxide film underlying the contact region 61 is also turned into the highly resistive layer 55b, it is also possible to directly connect the contact region 61 to the P-type semiconductor substrate 51 instead.

Next, FIG. 19 shows the structure of the self-regulating back-bias transistor composed of a partially depleted SOI transistor. The basic structure of the SOI shown in FIG. 19 is substantially the same as the structure shown in FIG. 18(d), except that the entire silicon dioxide film is turned into the highly resistive layer 55 and that the source 58 and drain 59 are not in contact with the highly resistive layer 55. Except for that, the structure is the same as the structure shown in FIG. 18(d).

In the step shown above in FIG. 18(c), which assumes the use of a fully depleted SOI transistor, the highly resistive layer 55a is formed in an area the length of which is smaller than the distance between the source 58 and drain 59 in order to prevent the occurrence of punch-through through the highly resistive layer 55a. In the case of using the partially depleted SOI transistor, however, there is no need to concern about the occurrence of such punch-through, since the source 58 and drain 59 are not in contact with the internal dioxide film. Therefore, even when the entire silicon dioxide film 52 is turned into the highly resistive layer 55, there is no possibility that the punch-through occurs. The P-type substrate can be a N-type substrate and the contact region 61 can be a $n^+$ region.

(Ninth Embodiment)

Next, a ninth embodiment will be described with reference to FIGS. 20 and 21.

In the above eighth embodiment, when the highly resistive layer 55a was formed inside the silicon dioxide film 52 in the step shown in FIG. 18(c), the resist mask 70 used in implanting the $Si^+$ ions in the area with the length smaller than the distance between the source 58 and drain 59 is formed with the slit with the length smaller than the ate length. However, since the gate electrode is mostly formed in the minimum dimensions in which a stepper can be constantly formed (design rule), it is difficult to constantly form a satisfactory resist mask 70 for ion implantation in that case. In view of the foregoing, the present embodiment will describe a method of constantly form a satisfactory resist mask.

Figure 20:
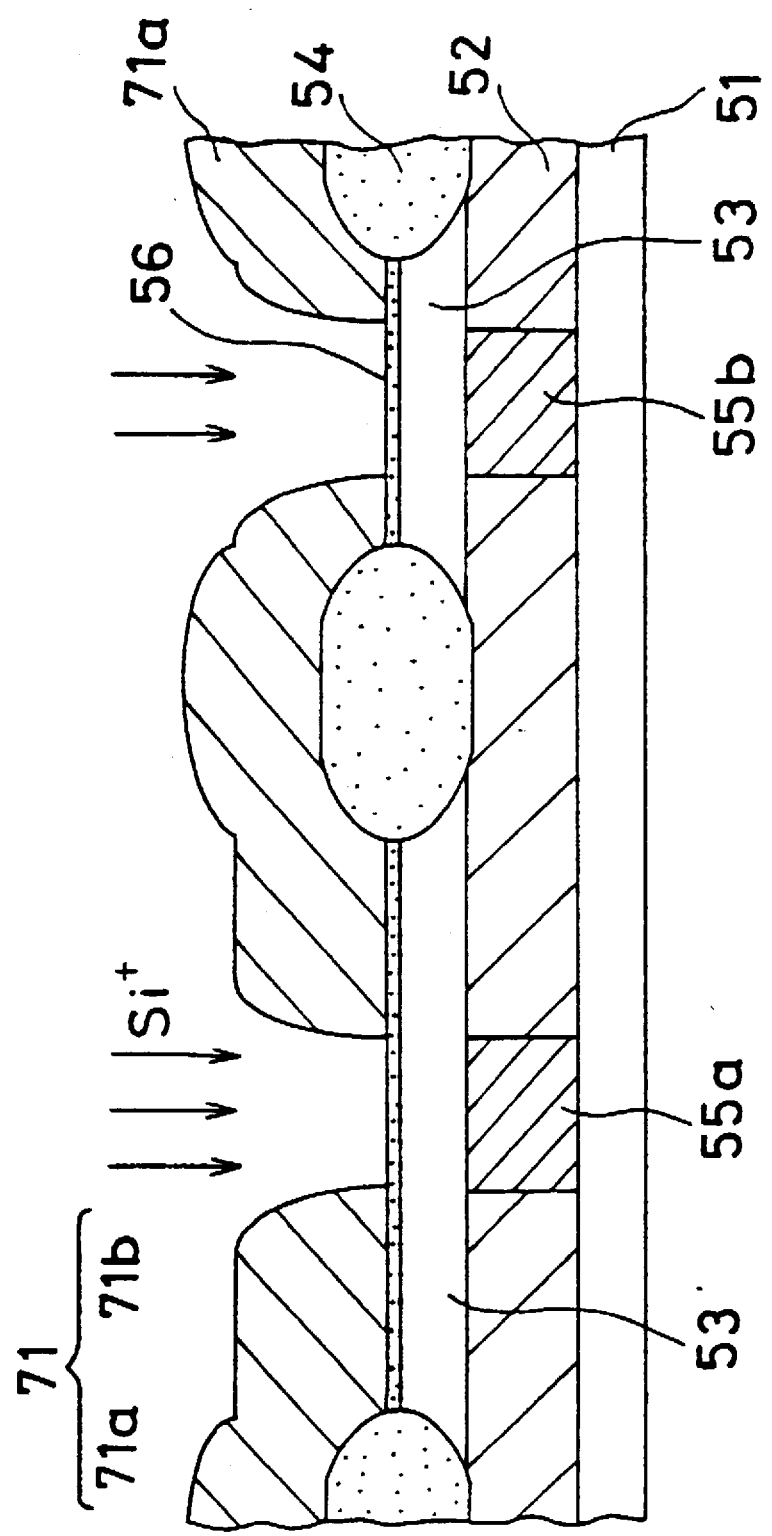
FIG. 20 is a cross-sectional view illustrating a method of forming a highly resistive layer in the N-channel MIS transistor of self-regulating back-bias type according to a ninth embodiment.

In an example shown in FIG. 20, a resist mask 71 for implanting the $Si^+$ ions into the silicon dioxide film 52 in the step of FIG. 18(c) is composed of a reverse resist mask 71a having a pattern obtained by reversing the pattern of the mask for forming the gate electrode with a sidewall 71b forming an opening thereof. Since the resist mask 71 can be formed using the same design rule used for the gate electrode, the present embodiment has an advantage in that it can constantly form a satisfactory mask for ion implantation.

Figure 21:
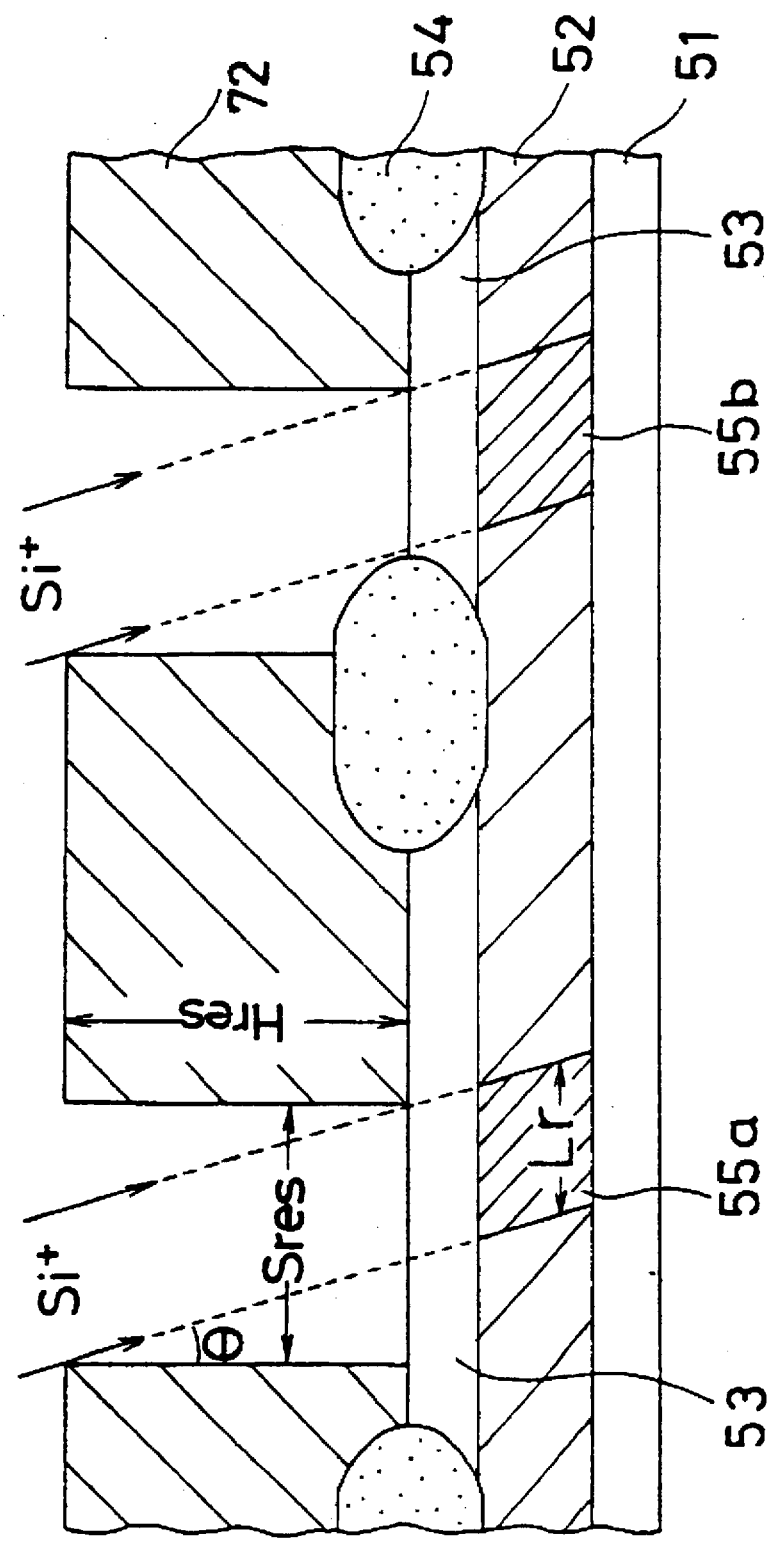
FIG. 21 is a cross-sectional view illustrating another method of forming a highly resistive layer in the N-channel MIS transistor of self-regulating back-bias type according to the ninth embodiment.
Figure 22:
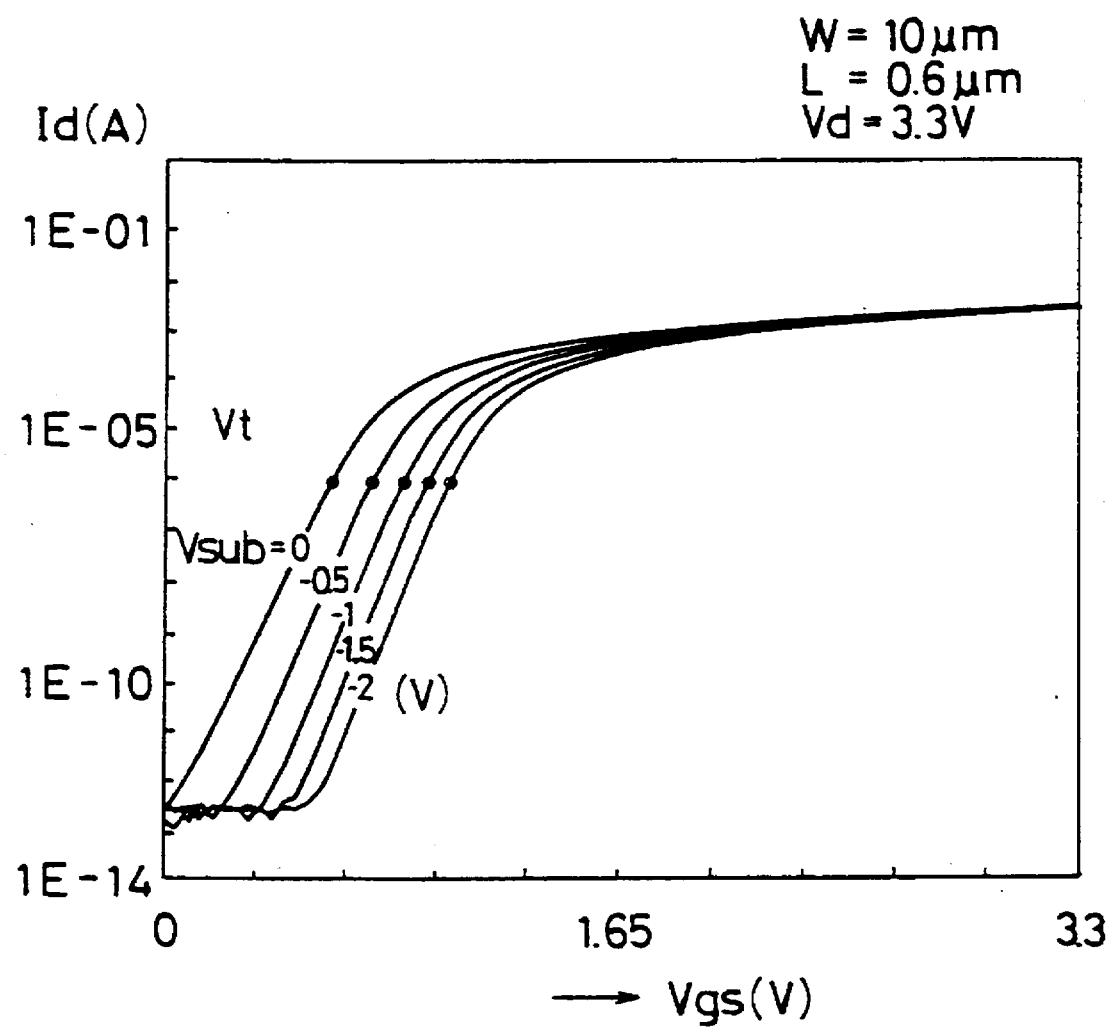
FIG. 22 is a view showing drain current characteristics which vary in accordance with variations in back bias for a general MIS transistor.
Figure 23:
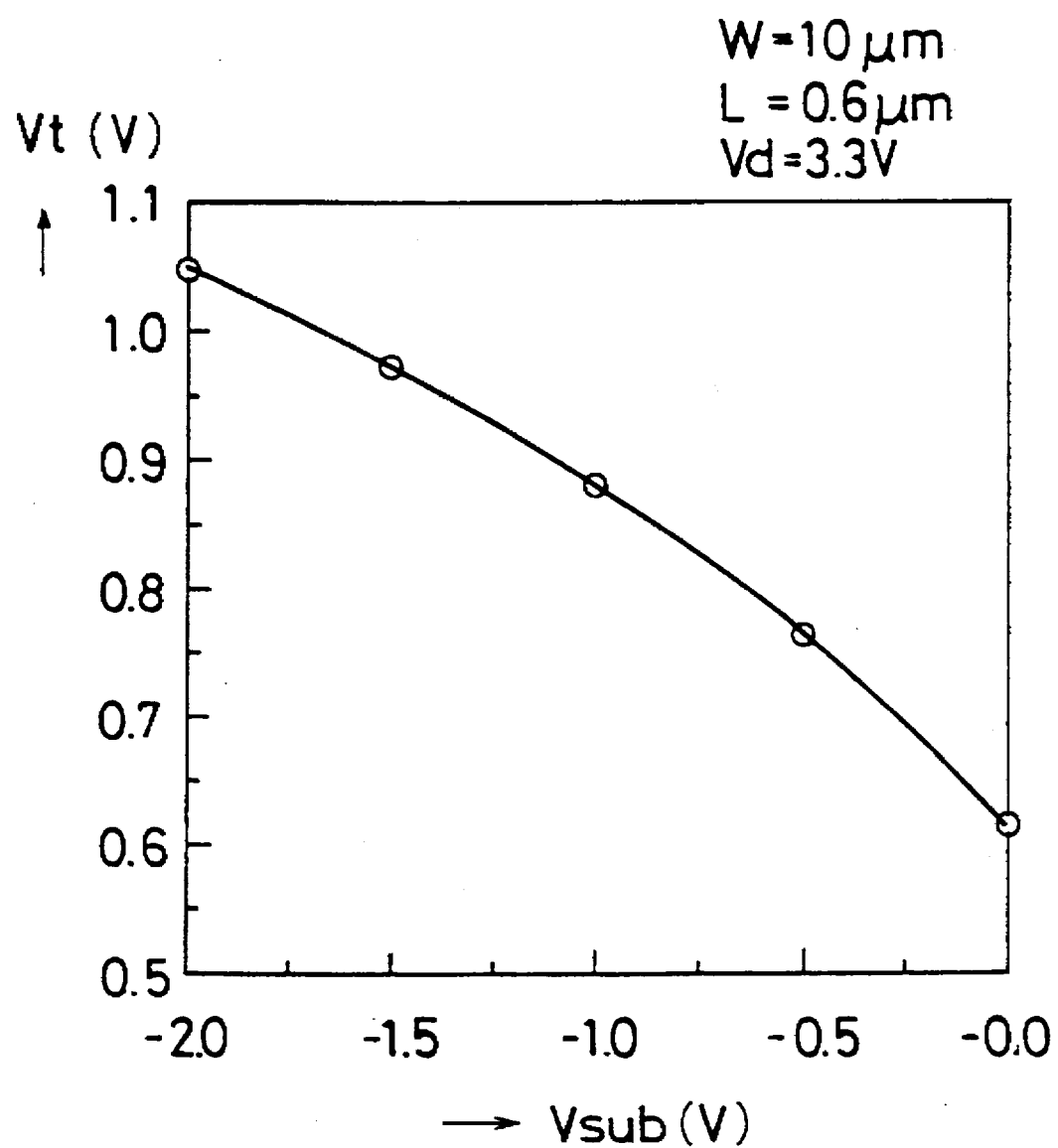

In an example shown in FIG. 21, a resist mask 72 having a pattern obtained by reversing the pattern of the mask for generating the gate electrode is used as it is by horizontally offsetting its position, and tilted ion implantation is performed. A relation established among the thickness Hres of the reverse resist mask 72, the slit interval in the reverse resist mask 72, the width Lr of the highly resistive layer 55a, the minimum dimensions Smin allowed in the exposure of the aperture pattern, the minimum gate length Lgmin, and the tilt angle θ in the tilted ion implantation is as follows:

$$Sres\ (=Lr+Hres \times \tan\theta) \geq Smin$$

(Smin is fulfilled when the MOS transistor has the minimum gate length-Lgmin).

With the method, it is possible to form, by utilizing a shadow effect, the highly resistive layer 55a with the length which is shorter than the gate length in a desired position.

We claim:

1. A semiconductor apparatus comprising:

a first-type MIS transistor having a substrate portion, a gate, a source, and a drain;

a back-bias terminal for receiving a constant back bias to be applied to the substrate portion of said first-type MIS transistor; and a resistor having a high electrical resistance interposed between the substrate portion of said first-type MIS transistor and the back-bias terminal, said first-type MIS transistor being constituted so that a potential of the substrate portion is self-regulated between one value in an active mode and the other value in standby mode.

2. A semiconductor apparatus according to claim 1, further comprising, a second-type MIS transistor having a substrate portion, a gate, a source, and a drain, the substrate portion of which is connected to said back-bias terminal via a non-resistive wire so that the back bias is constant in the active and standby modes.

3. A semiconductor apparatus according to claim 1 or 2, wherein a plurality of said first-type MIS transistors are disposed and the substrate portions of said first-type MIS transistors are connected in common to said back-bias generator via a resistor.

4. A semiconductor apparatus according to claim 1, further comprising a first-type integrated circuit consisting of a plurality of said first-type MIS transistors, each of said first-type MIS transistors having a resistor interposed between the substrate portion of the first-type MIS transistor and the back-bias terminal.

5. A semiconductor apparatus according to claim 4, wherein said first-type integrated circuit is a circuit for high-speed operation such as a sense amplifier, a read amplifier, a column decoder or a row decoder.

6. A semiconductor apparatus according to claim 4, further comprising a second-type integrated circuit wherein a plurality of said second-type MIS transistors are disposed.

7. A semiconductor apparatus according to claim 6, which functions as a semiconductor memory, wherein said first-type integrated circuit is a peripheral circuit of the semiconductor memory, and said second-type integrated circuit is a memory cell array of the semiconductor memory.

8. A semiconductor apparatus according to claim 4, wherein a plurality of said first-type integrated circuits are disposed and the resistance values of said resistors which are connected to the substrate portions of said MIS transistors of said individual first-type integrated circuits are individually set in advance, depending on the types of the individual first-type integrated circuits.

9. A semiconductor apparatus according to claim 8, wherein the resistance value of each of said resistors is preliminarily set to $0.1/Isubm$ or more wherein Isubm is a mean substrate current flowing through said first-type integrated circuit in operation.

10. A semiconductor apparatus according to claim 1, wherein said resistor is provided so as to intervene a connecting wire between said back-bias terminal and the substrate portion of said first-type MIS transistor.

11. A semiconductor apparatus according to claim 1, wherein said resistor is a highly resistive layer buried in the semiconductor substrate so that it is interposed in a region under a channel region of at least one of said self-regulating back-bias MIS transistors and main body of the substrate.

12. A semiconductor apparatus according to claim 11, wherein an isolation layer composed of an insulator is formed between at least a channel-side corner of the source/drain of said first-type MIS transistor and the highly resistive layer.

13. A semiconductor apparatus according to claim 11, wherein said highly resistive layer is composed of a semiconductor material having a same conductivity type as a conductivity type of the substrate and characteristics similar to characteristics of an intrinsic-type semiconductor material.

14. A semiconductor apparatus according to claim 1, wherein said resistor comprises at least one normally-on transistor.

15. A semiconductor apparatus according to claim 4, wherein said resistor is disposed in each of said first-type MIS transistor.

16. A semiconductor apparatus according to claim 11, wherein said semiconductor substrate is composed of a SOI (Silicon On Insulator) substrate obtained by forming a silicon film on an insulator, said first-type MIS transistor is formed on said silicon film, and said highly resistive layer is formed by introducing a large number of crystal defects into a region of the insulator of the SOI substrate which is positioned below a channel region of the first-type MIS transistor.

17. A semiconductor apparatus according to claim 16, wherein said highly resistive layer is formed in a region with a length which is smaller than a distance between the source and drain of the first-type MIS transistor.

18. A semiconductor apparatus according to claim 16 or 17, wherein a contact region for a connecting wire between said first-type MIS transistor and the back-bias terminal is also formed in a part of said silicon film and said highly resistive layer is also formed by introducing a plurality of crystal defects in that portion of said insulator which is positioned under said contact region.

19. A semiconductor apparatus according to claims 16, 17, or 18, wherein a large number of crystal defects in said highly resistive layer are formed by ion implantation in the insulator.

20. A method of operating a semiconductor apparatus having a substrate portion, a gate, a source, and a drain, comprising the steps of:

generating a constant voltage; and applying said constant voltage to the substrate portion of a MIS transistor via a path having a high resistance value.

21. A method of operating a semiconductor apparatus comprising, a MIS transistor having a substrate portion, a gate, a source, and a drain, a back-bias terminal for receiving a constant back bias to be applied to the substrate portion of said MIS transistor, and a resistor, and a resistor having a high value of resistance interposed between the substrate portion of said MIS transistor and the back-bias terminal, said method comprising the steps of:

estimating a value of a substrate current based on a potential of the substrate portion; and judging whether said MIS transistor is in an active mode or a standby mode.

22. A method of operating a semiconductor apparatus according to claim 21, wherein the semiconductor apparatus is controlled so that a power supply voltage is reduced in a circuit block consisting of a plurality of said MIS transistors when an estimated value of the substrate current in the circuit block reaches a specified value or lower.

23. A method of manufacturing a semiconductor apparatus having a highly resistive layer formed in a region where the length is smaller than the distance between a source and drain of a first-type MIS transistor comprising at least the steps of:

forming a resist mask for forming a gate electrode of said first-type MIS transistor;

forming a sidewall from a photoresist in a slit of said resist mask; and performing ion implantation by using, as a mask, said resist mask and the sidewall thereof so as to cause crystal defects in an insulating film.

24. A method of manufacturing a semiconductor apparatus having a highly resistive layer formed in a region where a length is smaller than a distance between a source and drain of a first-type MIS transistor comprising at least the steps of:

forming a resist mask having a pattern obtained by reversing the pattern of the mask for forming a gate electrode of said first-type MIS transistor in an offset position; and performing ion implantation from a tilted position above said resist mask so as to cause crystal defects in the insulating film.

25. A semiconductor apparatus comprising:

a first-type MIS transistor having a substrate portion, a gate, a source, and a drain;

a back-bias terminal for receiving a constant back bias to be applied to the substrate portion of said first-type MIS transistor; and a resistor having a high resistance value interposed between the substrate portion of said first-type MIS transistor and the back-bias terminal, said resistor being the only element coupled between said substrate portion of said first-type MIS transistor and said back-bias terminal, said first-type MIS transistor being constituted so that a potential of the substrate portion is self-regulated between one value in an active mode and the other value in a standby mode.

* * * * *

UNITED STATES PATENT AND TRADEMARK OFFICE
CERTIFICATE OF CORRECTION

PATENT NO. : 5,672,995
DATED : September 30, 1997
INVENTOR(S) : Junji HIRASE et al.

It is certified that error appears in the above-indentified patent and that said Letters Patent is hereby corrected as shown below:

Cover Page, line 3 at [54], in the title and col. 1, line 1, delete "INTERGRATED" and insert --INTEGRATED--;

Col. 11, line 13, delete "is Isub" and insert --Isub is--;

Col. 16, line 44, delete "and"; and line 48, after "terminal" insert -- ; and --.

Col. 17, line 38, after "and" insert --a--.

Col. 18, line 13, delete "claims" and insert --claim--; and line 48, after "mask" insert --having a pattern obtained by reversing the pattern of a mask --.

Signed and Sealed this

Nineteenth Day of May, 1998

Attest:

BRUCE LEHMAN

*Attesting Officer*    Commissioner of Patents and Trademarks